(12) United States Patent
Kim et al.

(10) Patent No.: US 10,468,396 B2
(45) Date of Patent: Nov. 5, 2019

(54) DISPLAY DEVICE AND MULTI-SCREEN DISPLAY DEVICE USING THE SAME

(71) Applicant: LG Display Co., Ltd., Seoul (KR)

(72) Inventors: HanSeok Kim, Paju-si (KR); JinYeong Kim, Goyang-si (KR); JaeWoo Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/798,960

(22) Filed: Oct. 31, 2017

(65) Prior Publication Data

US 2018/0190631 A1 Jul. 5, 2018

(30) Foreign Application Priority Data

Dec. 30, 2016 (KR) .......................... 10-2016-0184459

(51) Int. Cl.
*H01L 25/16* (2006.01)
*G06F 3/14* (2006.01)
(Continued)

(52) U.S. Cl.
CPC ........ *H01L 25/167* (2013.01); *G02F 1/13336* (2013.01); *G02F 1/13452* (2013.01); *G06F 3/1446* (2013.01); *H01L 25/162* (2013.01); *H01L 25/165* (2013.01); *H01L 27/124* (2013.01); *H01L 27/1218* (2013.01); *H01L 27/1248* (2013.01); *H01L 27/156* (2013.01); *H01L 33/505* (2013.01); *H01L 33/58* (2013.01);
(Continued)

(58) Field of Classification Search
CPC ..... H05K 1/0277–0281; G02F 1/1345–13454; G02F 1/13458; G02F 1/13336; G02F 1/133305; G02F 2001/13456; H01L 27/3297; H01L 27/3293; H01L 23/4985; H01L 51/0097; H01L 25/167; H01L 25/075; H01L 25/0753
See application file for complete search history.

(56) References Cited

U.S. PATENT DOCUMENTS 5,670,994 A * 9/1997 Kawaguchi ......... G02F 1/13452 257/E23.065
6,025,901 A * 2/2000 Adachi ............... G02F 1/13452 349/151

(Continued)

FOREIGN PATENT DOCUMENTS

JP 2003-43954 A 2/2003

*Primary Examiner* — Mariceli Santiago
(74) *Attorney, Agent, or Firm* — Seed IP Law Group LLP

(57) ABSTRACT

Disclosed is a display device and a multi-screen display device using the same, which include a minimized bezel area. The display device includes a display substrate including a plurality of subpixels, respectively provided in a plurality of pixel areas defined by a plurality of data lines and a plurality of gate lines, and a data pad part connected to each of the plurality of data lines in a one-to-one relationship and a data routing film adhered to the data pad part, the data routing film including a plurality of data routing lines respectively connected to the plurality of data lines. The data routing film is closely adhered to the display substrate to surround the data pad part, one side of the display substrate, and a rear surface of the display substrate overlapping the data pad part.

40 Claims, 13 Drawing Sheets

(51) Int. Cl.
    *H01L 33/50* (2010.01)
    *H01L 33/58* (2010.01)
    *H05K 1/18* (2006.01)
    *H05K 5/00* (2006.01)
    *G09F 9/302* (2006.01)
    *G09F 9/33* (2006.01)
    *H01L 27/32* (2006.01)
    *H01L 25/075* (2006.01)
    *G02F 1/1333* (2006.01)
    *G02F 1/1345* (2006.01)
    *H01L 27/12* (2006.01)
    *H01L 27/15* (2006.01)
    *H01L 33/62* (2010.01)
    *H05K 1/14* (2006.01)

(52) U.S. Cl.
    CPC ............ *H01L 33/62* (2013.01); *H05K 1/189* (2013.01); *H05K 5/0017* (2013.01); *H05K 5/0021* (2013.01); *G09F 9/3026* (2013.01); *G09F 9/33* (2013.01); *H01L 25/0753* (2013.01); *H01L 27/3293* (2013.01); *H01L 27/3297* (2013.01); *H05K 1/144* (2013.01); *H05K 1/147* (2013.01); *H05K 2201/041* (2013.01); *H05K 2201/049* (2013.01)

(56) References Cited

U.S. PATENT DOCUMENTS

| | | | |
|---|---|---|---|
| 6,307,606 B1* | 10/2001 | Takii | G02F 1/133514 349/106 |
| 8,425,069 B2* | 4/2013 | Yamamoto | G02B 5/0231 362/217.09 |
| 10,325,936 B2* | 6/2019 | Kang | H01L 27/1248 |
| 2005/0140260 A1 | 6/2005 | Park et al. | |
| 2007/0034402 A1* | 2/2007 | Cheng | G02F 1/13452 174/260 |
| 2008/0117367 A1 | 5/2008 | Abe | |
| 2013/0335660 A1* | 12/2013 | Jung | G02F 1/1345 349/42 |
| 2014/0085585 A1* | 3/2014 | Sung | G02F 1/13458 349/143 |
| 2014/0104528 A1* | 4/2014 | Jung | G02F 1/133305 349/43 |
| 2014/0218956 A1 | 8/2014 | Wu | |
| 2015/0261046 A1 | 9/2015 | Miki et al. | |
| 2016/0316578 A1 | 10/2016 | Cha | |
| 2016/0363800 A1 | 12/2016 | Kim | |
| 2016/0365027 A1 | 12/2016 | Suh | |
| 2016/0372514 A1 | 12/2016 | Chang et al. | |
| 2017/0294424 A1* | 10/2017 | Jeong | H01L 25/167 |
| 2018/0175268 A1* | 6/2018 | Moon | H01L 33/62 |
| 2018/0188579 A1* | 7/2018 | Jeong | G02F 1/13336 |

\* cited by examiner

DISPLAY DEVICE AND MULTI-SCREEN DISPLAY DEVICE USING THE SAME

CROSS-REFERENCE TO RELATED APPLICATIONS

This application claims the benefit of the Korean Patent Application No. 10-2016-0184459 filed on Dec. 30, 2016, which is hereby incorporated by reference as if fully set forth herein.

BACKGROUND

Technical Field

The present disclosure relates to a display device and a multi-screen display device using the same.

Discussion of the Related Art

Liquid crystal display (LCD) devices are being widely used as a display screen of notebook computers, tablet computers, smartphones, portable display devices, and portable information devices in addition to a display screen of television (TVs) and monitors.

LCD devices and organic light emitting display devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response speed are reduced. Since the organic light emitting display devices include an organic material, the organic light emitting display devices are vulnerable to water, causing a reduction in reliability and lifetime.

Recently, research and development on light emitting diode display devices including a light emitting device are being done. The light emitting diode display devices have high image quality and high reliability, and thus, are attracting much attention as next-generation display devices.

A related art light emitting diode display device is manufactured by transferring a light emitting device onto a thin film transistor (TFT) array substrate, and due to time taken in a transfer process for the light emitting device, current transfer technology is more advantageous to display devices having a relatively large size than panels having a relatively small size.

However, the related art light emitting diode display device includes a pad part connected to pixel driving lines of a display substrate and an instrument for covering a display driving circuit unit attached on the pad part, and for this reason, a bezel area increases due to the instrument.

Moreover, in a case where the related art light emitting diode display device is manufactured to have a large size, the number of pixels increases, and for this reason, a transfer error rate of a light emitting device increases, causing a reduction in productivity. In order to solve such a problem, research and development are being recently done on multi-screen display devices which realize a large-size screen and are implemented by connecting two or more light emitting diode display devices having a relatively small size. However, in the multi-screen display devices, due to a bezel area of each of the two or more light emitting diode display devices, a seam (or a boundary portion) exists between display devices coupled to each other. When displaying one image on a whole screen, the boundary portion causes a sense of discontinuity of the whole screen, causing a reduction in degree of viewing immersion of a user.

SUMMARY

Accordingly, the present disclosure is directed to providing a display device and a multi-screen display device using the same that may substantially obviate one or more problems due to limitations and disadvantages of the related art.

An aspect of the present disclosure is directed to providing a display device and a multi-screen display device using the same, which include a minimized bezel area.

Another aspect of the present disclosure is directed to provide a multi-screen display device in which a boundary portion between adjacent display devices is minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

As embodied and broadly described herein, there is provided a display device including a display substrate including a plurality of subpixels, respectively provided in a plurality of pixel areas defined by a plurality of data lines and a plurality of gate lines, and a data pad part connected to each of the plurality of data lines in a one-to-one relationship and a data routing film adhered to the data pad part, the data routing film including a plurality of data routing lines respectively connected to the plurality of data lines. The data routing film is closely adhered to the display substrate to surround the data pad part, one side of the display substrate, and a rear surface of the display substrate overlapping the data pad part.

The display device may further include a gate routing film including a plurality of gate routing lines respectively connected to the plurality of gate lines. The display substrate may further include a gate pad part connected to each of the plurality of gate lines in a one-to-one relationship, and the gate routing film may be closely adhered to the display substrate to surround the gate pad part, another side of the display substrate, and the rear surface of the display substrate overlapping the gate pad part.

Each of the data routing film and the gate routing film may include a light blocking layer.

In another aspect of the present disclosure, there is provided a display device comprising: a display substrate including a plurality of subpixels, respectively provided in a plurality of pixel areas defined by a plurality of data lines and a plurality of gate lines, and a pad part connected to each of the plurality of data lines or gate lines in a one-to-one relationship; and a routing film adhered to the pad part, the routing film including a plurality of data routing lines respectively connected to the plurality of data lines or a plurality of gate routing lines respectively connected to the plurality of gate lines, wherein the routing film is attached on the pad part provided in a front edge of the display substrate.

In another aspect of the present disclosure, there is provided a multi-screen display device including a plurality of screen modules each including a display device and a plurality of module coupling members coupling side surfaces of the plurality of screen modules. The display device includes a display substrate including a plurality of subpixels, respectively provided in a plurality of pixel areas defined by a plurality of data lines and a plurality of gate lines, and a data pad part connected to each of the plurality of data lines in a one-to-one relationship and a data routing film adhered to the data pad part, the data routing film including a plurality of data routing lines respectively connected to the plurality of data lines. The data routing film is closely adhered to the display substrate to surround the data pad part, one side of the display substrate, and a rear surface of the display substrate overlapping the data pad part.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
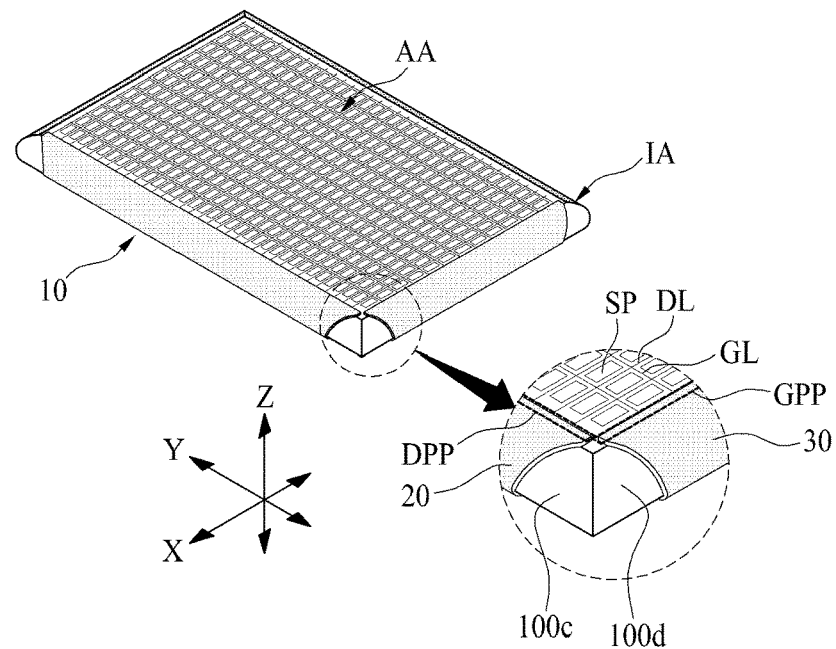
FIG. 1 is an isometric view illustrating a display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a display device and a multi-screen display device using the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
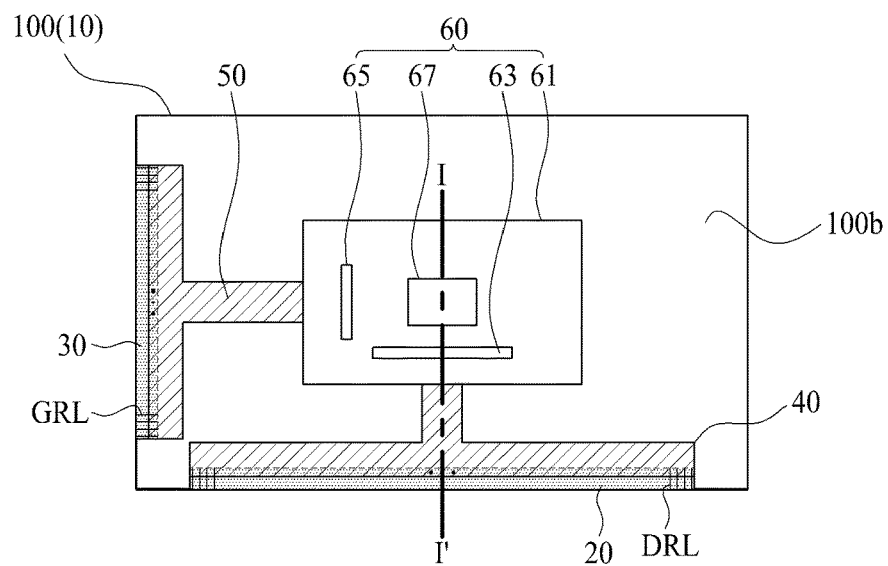
FIG. 2 is a plan view illustrating a rear surface of a display device according to an embodiment of the present disclosure.
Figure 3:
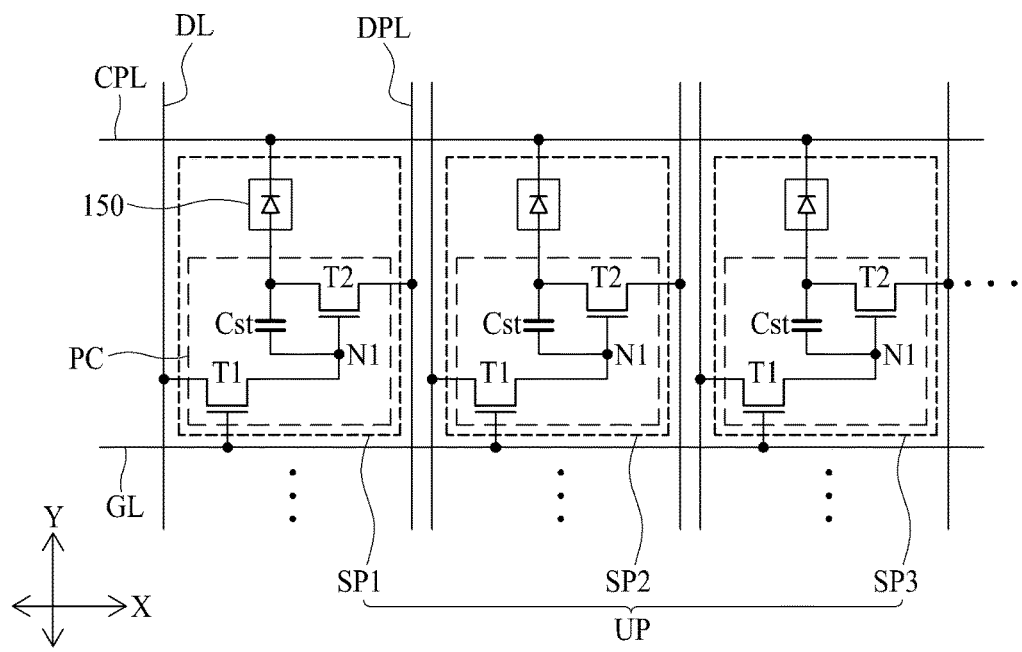
FIG. 3 is a circuit diagram of a unit pixel illustrated in FIG. 1.
Figure 4:
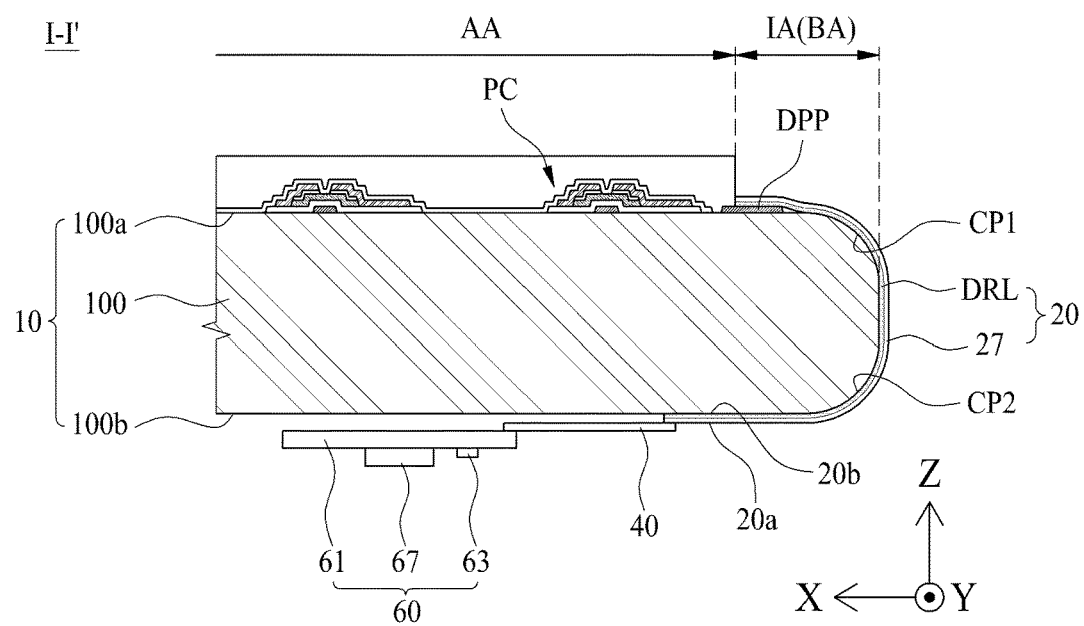
FIGS. 4 and 5 are schematic cross-sectional views taken along line I-I' illustrated in FIG. 2.

FIG. 1 is an isometric view illustrating a display device according to an embodiment of the present disclosure. FIG. 2 is a plan view illustrating a rear surface of the display device according to an embodiment of the present disclosure. FIG. 3 is a circuit diagram of a unit pixel illustrated in FIG. 1. FIG. 4 is a schematic cross-sectional view taken along line I-I' illustrated in FIG. 2.

Referring to FIGS. 1 to 4, the display device according to the present embodiment may include a display substrate 10 and a data routing film 20.

The display substrate 10 may be defined as a thin film transistor (TFT) array substrate. The display substrate 10 according to an embodiment may include a base plate 100, a plurality of pixel driving lines, and a plurality of subpixels SP1 to SP3.

The base plate 100 may be formed of glass or a plastic material, and for example, may be formed of a glass material. The base plate 100 according to an embodiment may include a display area (or an active area) AA and a non-display area (or an inactive area) IA. The display area AA may be defined as a center area other than an edge of the base plate 100. The non-display area IA may be defined to surround the display area AA and may overlap the edge of the base plate 100. The non-display area IA may have a relatively very narrow width and may be defined as a bezel area.

The pixel driving lines may be provided on a front surface 100a of the base plate 100 and may supply signals necessary for each of the plurality of subpixels SP1 to SP3. The pixel driving lines according to an embodiment may include a plurality of data lines DL, a plurality of gate lines GL, a plurality of driving power lines DPL, and a plurality of common power lines CPL.

The plurality of data lines DL may be provided on the front surface 100a of the base plate 100, may long extend along a second horizontal axis direction Y, may be arranged along a first horizontal axis direction X, and may be spaced apart from each other by a certain interval. Here, the first horizontal axis direction X may be parallel to a first lengthwise direction X of the display device, for example, a long side length direction or a widthwise direction of the display device, and the second horizontal axis direction Y may be parallel to a second lengthwise direction Y of the display device, for example, a short side length direction or a lengthwise direction of the display device.

The plurality of gate lines GL may be provided on the front surface 100a of the base plate 100 to intersect the plurality of data lines DL, may long extend along the first horizontal axis direction X, may be arranged along the second horizontal axis direction Y, and may be spaced apart from each other by a certain interval.

The plurality of driving power lines DPL may be provided on the base plate 100 in parallel with the plurality of data lines DL and may be formed along with the plurality of data lines DL. Each of the plurality of driving power lines DPL may supply a pixel driving power, supplied from the outside, to adjacent subpixels SP1 to SP3.

The plurality of common power lines CPL may be arranged on the base plate 100 in parallel with the plurality of gate lines GL and may be formed along with the plurality of gate lines GL. Each of the plurality of common power lines CPL may supply a common power, supplied from the outside, to adjacent subpixels SP1 to SP3.

The plurality of subpixels SP1 to SP3 may be respectively provided in a plurality of subpixel areas defined by intersections of the gate lines GL and the data lines DL. Each of the plurality of subpixels SP1 to SP3 may be defined as an area corresponding to a minimum unit where light is actually emitted.

At least three adjacent subpixels SP1 to SP3 may configure one unit pixel UP for displaying colors. For example, the one unit pixel UP may include a red subpixel SP1, a green subpixel SP2, and a blue subpixel SP3 which are adjacent to each other along the first horizontal axis direction X, and may further include a white subpixel for enhancing luminance.

Optionally, each of the driving power lines DPL may be provided in one corresponding unit pixel of a plurality of unit pixels UP. In this case, at least three subpixels SP1 to SP3 configuring each unit pixel UP may share one driving power line DPL. Therefore, the number of driving power lines for driving each of the subpixels SP1 to SP3 is reduced, and in proportion to the reduced number of the driving power lines, an aperture rate of each of the unit pixels UP increases or a size of each of the unit pixel UP decreases.

The plurality of subpixels SP1 to SP3 according to an embodiment may each include a pixel circuit PC and a light emitting device 150.

The pixel circuit PC may be provided in a circuit area defined in each subpixel SP and may be connected to a gate line GL, a data line DL, and a driving power line DPL which are adjacent thereto. The pixel circuit PC may control a current flowing in the light emitting device 150 according to a data signal supplied through the data line DL in response to a scan pulse supplied through the gate line GL, based on the pixel driving power supplied through the driving power line DPL. The pixel circuit PC according to an embodiment may include a switching TFT T1, a driving TFT T2, and a capacitor Cst.

The switching TFT T1 may include a gate electrode connected to the gate line GL, a first electrode connected to the data line DL, and a second electrode connected to a gate electrode N1 of the driving TFT T2. Here, each of the first and second electrodes of the switching TFT T1 may be a source electrode or a drain electrode according to a direction of a current. The switching TFT T1 may be turned on according to the scan pulse supplied through the gate line GL and may supply the data signal, supplied through the data line DL, to the driving TFT T2.

The driving TFT T2 may be turned on by a voltage supplied through the switching TFT T1 and/or a voltage of the capacitor Cst to control the amount of current flowing from the driving power line DPL to the light emitting device 150. To this end, the driving TFT T2 according to an embodiment may include a gate electrode connected to the second electrode N1 of the switching TFT T1, a drain electrode connected to the driving power line DPL, and a source electrode connected to the light emitting device 150. The driving TFT T2 may control a data current flowing from the driving power line DPL to the light emitting device 150 according to the data signal supplied through the switching TFT T1, thereby allowing the light emitting device 150 to emit light.

The capacitor Cst may be provided in an overlap area between the gate electrode N1 and the source electrode of the driving TFT T2, may store a voltage corresponding to the data signal supplied to the gate electrode of the driving TFT T2, and may turn on the driving TFT T2 with the stored voltage.

Optionally, the pixel circuit PC may further include at least one compensation TFT for compensating for a threshold voltage shift of the driving TFT T2, and moreover, may further include at least one auxiliary capacitor. The pixel circuit PC may be additionally supplied with a compensation power such as an initialization voltage, based on the number of TFTs and auxiliary capacitors. Therefore, the pixel circuit PC according to the present embodiment may drive the light emitting device 150 through a current driving manner identically to each subpixel of an organic light emitting display device, and thus, may be replaced with a pixel circuit of organic light emitting display devices known to those skilled in the art.

The light emitting device 150 may be provided in each of the plurality of subpixels SP1 to SP3. The light emitting device 150 may be electrically connected to the pixel circuit PC of a corresponding subpixel SP and a corresponding common power line CPL, and thus, may emit light with a current flowing from the pixel circuit PC (i.e., the driving TFT T2) to the common power line CPL. The light emitting device 150 according to an embodiment may be a light emitting diode or a micro light emitting diode chip which emits one of red light, green light, blue light, and white light. Here, the micro light emitting diode chip may have a scale of 1 μm to 100 μm, but is not limited thereto. In other embodiments, the micro light emitting diode chip may have a size which is less than that of an emissive area other than a circuit area occupied by the pixel circuit PC in a corresponding subpixel area.

The display substrate 10 according to an embodiment may further include a data pad part DPP provided in one non-display area and a gate pad part GPP provided in another non-display area. Here, the one non-display area of the display substrate 10 may be defined as a lower edge of the front surface 100a of the base plate 100 two-dimensionally, and the other non-display area of the display substrate 10 may be defined as a right edge of the front surface 100a of the base plate 100 two-dimensionally. However, the present embodiment is not limited thereto.

The data pad part DPP may be provided in one non-display area of the base plate 100. The data pad part DPP may include a plurality of data pads which are respectively connected to one ends of the plurality of data lines in a one-to-one relationship and each include a portion exposed to the front surface of the base plate 100.

The gate pad part GPP may be provided in the other non-display area of the base plate 100. The gate pad part GPP may include a plurality of gate pads which are respectively connected to one ends of the plurality of gate lines in a one-to-one relationship and each include a portion exposed to the front surface of the base plate 100.

In addition, the display substrate 10 according to an embodiment may include an inclined part or a curvature part which is provided in an upper corner CP1 between the front surface 100a and each side surface. That is, the upper corner CP1 of the display substrate 10 may be chamfered by a certain angle or a certain length through a chamfer process, or may be rounded to have a certain curvature by a grinding process (or a substrate rounding process). Likewise, the display substrate 10 according to an embodiment may include an inclined part or a curvature part which is provided in a lower corner CP2 between a rear surface 100b and each side surface. That is, the lower corner CP2 of the display substrate 10 may be chamfered by a certain angle or a certain length through a chamfer process, or may be rounded to have a certain curvature by a grinding process (or a substrate rounding process). Therefore, in the present embodiment, each corner of the display substrate 10 may be inclined without being sharpened or may have a curved shape, and thus, a data routing film and a gate routing film may be closely adhered to each side of the display substrate 10.

Optionally, each side of the display substrate 10 according to an embodiment may have a curved surface (for example, a cross-sectional surface having a semicircular shape or a semielliptical shape) having a certain curvature through a grinding process (or a substrate rounding process).

The data routing film 20 may supply a data signal to each of the plurality of data lines DL through the data pad part DPP. The data routing film 20 according to an embodiment may include a plurality of data routing lines DRL respectively connected to the plurality of data lines DL and may be adhered to the data pad part DPP. In this case, the data routing film 20 may be directly adhered to the display substrate 10 to surround the data pad part DPP, one side 100c of the display substrate 10, and the rear surface 100b of the display substrate 10 overlapping the data pad part DPP. Here, the plurality of data routing lines DRL exposed to one edge of the data routing film 20 may be electrically connected to the plurality of data pads through a conductive adhesive member, respectively.

The data routing film 20 may be directly adhered (or bonded) to a front edge of the base plate 100 overlapping the data pad part DPP, the one side 100c of the base plate 100 contacting the front edge of the base plate 100, and one edge of the base plate 100 including a rear edge of the base plate 100 overlapping the data pad part DPP, thereby surrounding the one edge of the base plate 100. In this case, since the data routing film 20 has flexibility, the data routing film 20 may be bent in a D-shape, a concave shape, or a shape matching the one edge of the base plate 100 and may be closely adhered to the one edge of the base plate 100. Therefore, in the present embodiment, the data routing film 20 may surround the one edge of the base plate 100 including the data pad part DPP, thereby minimizing an increase in one bezel area of the display substrate 10 caused by the data routing film 20 adhered to the data pad part DPP.

The display device according to the present embodiment may further include a gate routing film 30.

The gate routing film 30 may supply the scan pulse to each of the plurality of gate lines GL through the gate pad part GPP. The gate routing film 30 according to an embodiment may include a plurality of gate routing lines GRL respectively connected to the plurality of gate lines GL and may be adhered to the gate pad part GPP. In this case, the gate routing film 30 may be directly adhered to the display substrate 10 to surround the gate pad part GPP, the other side 100d of the display substrate 10, and the rear surface 100b of the display substrate 10 overlapping the gate pad part GPP. Here, the plurality of gate routing lines GRL exposed to one edge of the gate routing film 30 may be electrically connected to the plurality of gate pads through a conductive adhesive member, respectively.

The gate routing film 30 may be directly adhered (or bonded) to a front edge of the base plate 100 overlapping the gate pad part GPP, the other side 100d of the base plate 100 contacting the front edge of the base plate 100, and the other edge of the base plate 100 including a rear edge of the base plate 100 overlapping the gate pad part GPP, thereby surrounding the other edge of the base plate 100. In this case, since the gate routing film 30 has flexibility, the gate routing film 30 may be bent in a ⊃-shape or a shape matching the other edge of the base plate 100 and may be closely adhered to the other edge of the base plate 100. Therefore, in the present embodiment, the gate routing film 30 may surround the other edge of the base plate 100 including the gate pad part GPP, thereby minimizing an increase in the other bezel area of the display substrate 10 caused by the gate routing film 30 adhered to the gate pad part GPP.

The display device according to the present embodiment may further include a first flexible printed circuit film 40, a second flexible printed circuit film 50, and a display driving circuit unit 60.

The first flexible printed circuit film 40 may be electrically connected to the display substrate 10, namely, the other edge of the data routing film 20 disposed on one side of a rear surface of the base plate 100. That is, the first flexible printed circuit film 40 may be electrically bonded to the other edge of the data routing film 20 and may be connected to each of the plurality of data routing lines DRL provided on the data routing film 20 in a one-to-one relationship, in the one side of the rear surface of the base plate 100. Here, the plurality of data routing lines DRL exposed to the other edge of the data routing film 20 may be respectively connected to a plurality of first signal transmission lines provided on the first flexible printed circuit film 40 through a conductive adhesive member. The first flexible printed circuit film 40 may transfer a data signal, supplied from the display driving circuit unit 60, to each of the plurality of data routing lines DRL.

The first flexible printed circuit film 40 according to an embodiment may be adhered to a front surface 20a or a rear surface 20b of the data routing film 20, based on a position of each of the plurality of data routing lines DRL exposed to the other edge of the data routing film 20.

For example, in a case where each of the plurality of data routing lines DRL exposed to the other edge of the data routing film 20 faces the rear surface of the display substrate 10 without directly facing the rear surface 100b of the base plate 100 because the other edge of the data routing film 20 is adhered to the rear surface 100b of the base plate 100, as illustrated in FIG. 4, the first flexible printed circuit film 40 may be adhered to the front surface 20a of the data routing film 20.

Figure 5:
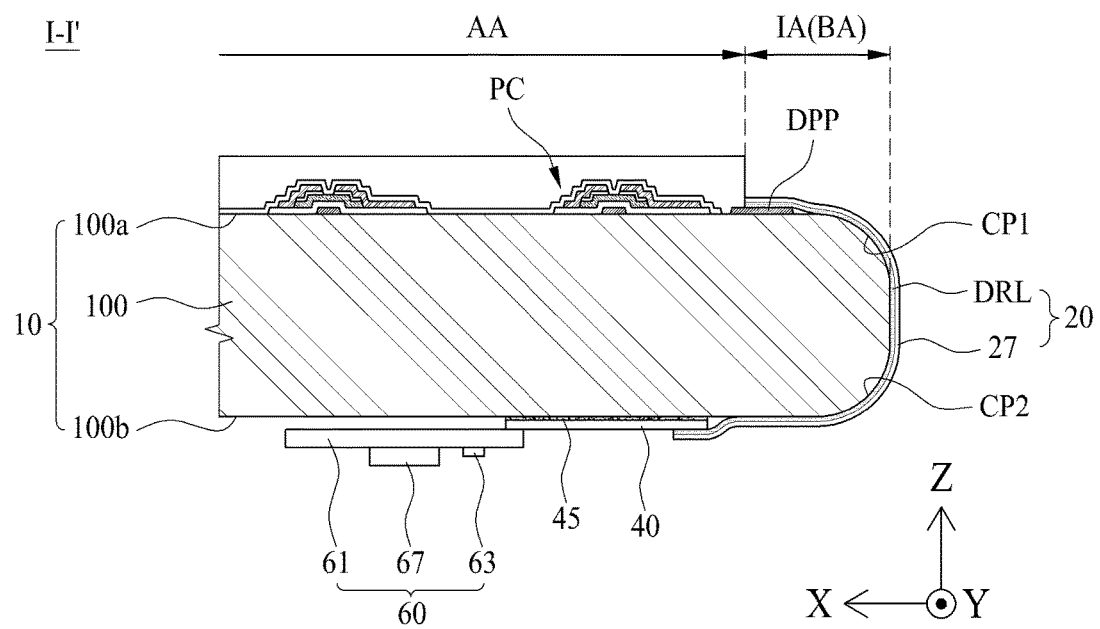

As another example, in a case where each of the plurality of data routing lines DRL exposed to the other edge of the data routing film 20 directly faces the rear surface 100b of the base plate 100, as illustrated in FIG. 5, the first flexible printed circuit film 40 may be adhered to the rear surface 20b of the data routing film 20 and may be adhered to the rear surface 100b of the base plate 100 by using a film supporting member 45 such as a double-sided tape. That is, the first flexible printed circuit film 40 may be disposed between the rear surface 100b of the base plate 100 and the other edge of the data routing film 20.

The second flexible printed circuit film 50 may be electrically connected to the display substrate 10, namely, the other edge of the gate routing film 30 disposed on the other side of the rear surface of the base plate 100. That is, the second flexible printed circuit film 50 may be electrically bonded to the other edge of the gate routing film 30 and may be connected to each of the plurality of gate routing lines GRL provided on the gate routing film 30 in a one-to-one relationship, in the other side of the rear surface of the base plate 100. Here, the plurality of gate routing lines GRL exposed to the other edge of the gate routing film 30 may be respectively connected to a plurality of second signal transmission lines provided on the second flexible printed circuit film 50 through a conductive adhesive member. The second flexible printed circuit film 50 may transfer the scan pulse, supplied from the display driving circuit unit 60, to each of the plurality of gate routing lines GRL.

Identically to the first flexible printed circuit film 40, the second flexible printed circuit film 50 according to an embodiment may be adhered to a front surface or a rear surface of the gate routing film 30, based on a position of each of the plurality of gate routing lines GRL exposed to the other edge of the gate routing film 30.

The display driving circuit unit 60 may be electrically connected to each of the first flexible printed circuit film 40 and the second flexible printed circuit film 50. The display driving circuit unit 60 may generate data signals to output the data signals to the first flexible printed circuit film 40 and may generate the scan pulse to output the scan pulse to the second flexible printed circuit film 50. The display driving circuit unit 60 according to an embodiment may include a printed circuit board (PCB) 61, a data driving circuit 63, a gate driving circuit 65, and a timing controller 67.

The PCB 61 may be disposed on the display substrate 10, namely, the rear surface of the base plate 100. The PCB 61 may be electrically connected to the plurality of first signal transmission lines exposed to the other edge of the first flexible printed circuit film 40 and may be electrically connected to the plurality of second signal transmission lines exposed to the other edge of the second flexible printed circuit film 50.

The data driving circuit 63 may be mounted on the PCB 61 and may generate data signals, which are to be supplied to the plurality of data lines DL, to output the data signals to the first flexible printed circuit film 40. The data driving circuit 63 according to an embodiment may receive subpixel data and a data control signal supplied from the timing controller 67, convert the subpixel data into a subpixel-based analog data voltage, and output the analog data voltage to a corresponding data line DL. Optionally, the data driving circuit 63 may be implemented as a plurality of data driving integrated circuits (ICs) without being mounted on the PCB 61 and may be mounted on the first flexible printed circuit film 40.

The gate driving circuit 65 may be mounted on the PCB 61 and may generate the scan pulse, which is to be supplied to the plurality of gate lines GL, to output the scan pulse to the second flexible printed circuit film 50. The gate driving circuit 65 according to an embodiment may generate the scan pulse, based on a gate control signal supplied from the timing controller 67 and may output the generated scan pulse to the second flexible printed circuit film 50 in a predetermined order. Optionally, the gate driving circuit 65 may be implemented as a plurality of gate driving ICs without being mounted on the PCB 61 and may be mounted on the second flexible printed circuit film 50. Optionally, the gate driving circuit 65 may be a shift register circuit which is directly provided on the display substrate 10, namely, in the other non-display area of the base plate 100 and is connected to each of the plurality of gate lines GL in a one-to-one relationship. In a case where the gate driving circuit 65 is configured with the shift register circuit, the second flexible printed circuit film 50 and the gate routing film 30 may perform only a function of transferring the gate control signal, supplied from the timing controller 67, to the gate driving circuit 65, and thus, the gate routing film 30 has a size which is relatively smaller than that of the data routing film 20.

In the display device according to an embodiment, the routing films 20 and 30 electrically connected to the respective pad parts DPP and GPP may be closely adhered to the display substrate 10 (i.e., an edge of the base plate 100), thereby minimizing an increase in a bezel area caused by the routing films 20 and 30. That is, the pad parts DPP and GPP provided on the front surface 100a of the display substrate 10 may be electrically connected to the display driving circuit unit 60 disposed on the rear surface of the display substrate 10 through the routing films 20 and 30 closely adhered to the edge of the base plate 100, and thus, the display device according to the present embodiment has a minimized bezel area BA. Accordingly, the display device according to the present embodiment has a bezel area BA suitable for minimizing a boundary portion between display devices coupled to each other in a multi-screen display device.

Figure 6:
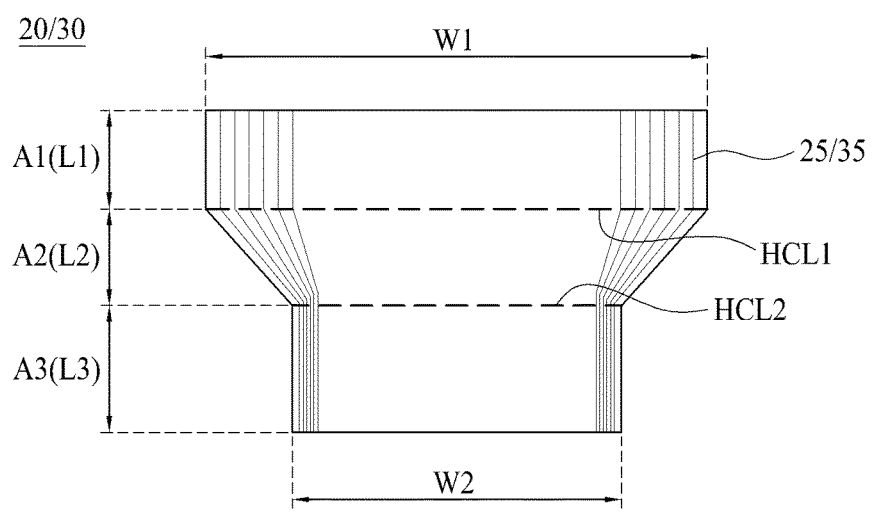
FIG. 6 is a diagram for describing a plane structure of each of a data routing film and a gate routing film illustrated in FIG. 1.

FIG. 6 is a diagram for describing a plane structure of each of the data routing film and the gate routing film illustrated in FIG. 1.

Referring to FIG. 6 along with FIG. 1, the data routing film 20 according to an embodiment may include the plurality of data routing lines DRL and may include a first area A1, a second area A2, and a third area A3 which are distinguished from each other depending on a position adhered to the display substrate 10, namely, the base plate 100.

The first area A1 may have a first width W1 and may be adhered to the data pad part DPP. That is, the first area A1 may be defined as an area which overlaps one edge of each of the plurality of data routing lines DRL and is adhered to the data pad part DPP. The first area A1 may have the first width W1 and a first length L1 for covering a whole portion of the data pad part DPP provided on the display substrate 10. Here, the first width W1 may be set to equal to or more than a length between a first data pad connected to a first data line and a last data pad connected to a last data line and to less than a long side length of the base plate 100 parallel to a lengthwise direction of the gate line GL. Also, the first length L1 may be set to equal to or less than a width of one non-display area IA of the display substrate 10 with the data pad part DPP provided thereon.

The second area A2 may have a second width W2 different from the first width W1, may extend from the first area A1, and may be closely adhered to the one side 100c of the display substrate 10. That is, the second area A2 may be defined as an area which overlaps a center portion of each of the plurality of data routing lines DRL and is closely adhered to the one side 100c of the display substrate 10.

A width of the second area A2 according to an embodiment may be progressively narrowed in a direction from the first area A1 to the third area A3. That is, in a case where the second area A2 has the first width W1 all over the data routing film 20, the data routing film 20 overlaps or interferes with the gate routing film 30 in the rear edge of the base plate 100, and thus, in order to solve such an interference problem, the second area A2 may extend to have the second width W2 which is narrower than the first width W1 and is progressively reduced in a direction from the first area A1 to the rear surface 100b of the base plate 100. In this case, the width of the second area A2 may be reduced in a direction toward a center of the width, and thus, both side surfaces of the second area A2 may be inclined between the first area A1 and the third area A3. Accordingly, the both side surfaces of the second area A2 may be progressively spaced apart from a short side of the base plate 100 in a direction from the front surface 100a to the rear surface 100b of the base plate 100.

The second width W2 of the second area A2 according to an embodiment may be set within a range which does not overlap or interfere with the gate routing film 30 in the rear edge of the base plate 100, based on a reference line pitch between the plurality of data routing lines DRL. Also, the second area A2 may have a second length L2 corresponding to a thickness (or a height) of the base plate 100.

The third area A3 may extend from the second area A2 to have the second width W2 and may be partially or wholly adhered to the rear surface 100b of the display substrate 10. That is, the third area A3 may be defined as an area which overlaps the other edge of each of the plurality of data routing lines DRL and is disposed in the rear edge of the display substrate 10. The third area A3 may be an area connected to the first flexible printed circuit film 40 and may have a third length L3 within a range which enables a film attach process to be easily performed. In addition, the third area A3 may have a width which is incrementally reduced depending on the number of the data routing lines DRL.

Optionally, the data routing film 20 according to an embodiment may further include at least one first half cutting line HCL1, provided in a boundary portion between the first area A1 and the second area A2, and at least one second half cutting line HCL2 provided in a boundary portion between the second area A2 and the third area A3.

The at least one first half cutting line HCL1 may be concavely provided in the data routing film 20 to have a cross-sectional surface having a semicircular, triangular, or tetragonal shape. The at least one first half cutting line HCL1 enables the data routing film 20 to be easily bent in the upper corner CP1 (see FIG. 4) of the base plate 100 and minimizes a damage of the data routing line DRL caused by a bending stress of the data routing film 20 which is bent and closely adhered to the upper corner of the base plate 100.

The at least one second half cutting line HCL2 may be concavely provided in the data routing film 20 to have a cross-sectional surface having a semicircular, triangular, or tetragonal shape. The at least one second half cutting line HCL2 enables the data routing film 20 to be easily bent in the lower corner CP2 (see FIG. 4) of the base plate 100 and minimizes a damage of the data routing line DRL caused by a bending stress of the data routing film 20 which is bent and closely adhered to the lower corner of the base plate 100.

The gate routing film 30 according to an embodiment may include the plurality of gate routing lines GRL and may include a first area A1, a second area A2, and a third area A3 which are distinguished from each other depending on a position adhered to the display substrate 10, namely, the base plate 100. Except that a first width W1 of the first area A1 is set to equal to or more than a length between a first gate pad and a last gate pad included in the gate pad part and to less than a short side length of the base plate 100 parallel to a lengthwise direction of the data line DL, the gate routing film 30 including the first to third areas A1 to A3 is the same as the above-described data routing film 20, and thus, its detailed description is not repeated.

Optionally, identically to the data routing film 20, the gate routing film 30 according to an embodiment may further include at least one first half cutting line HCL1, provided in a boundary portion between the first area A1 and the second area A2, and at least one second half cutting line HCL2 provided in a boundary portion between the second area A2 and the third area A3.

Figure 7:
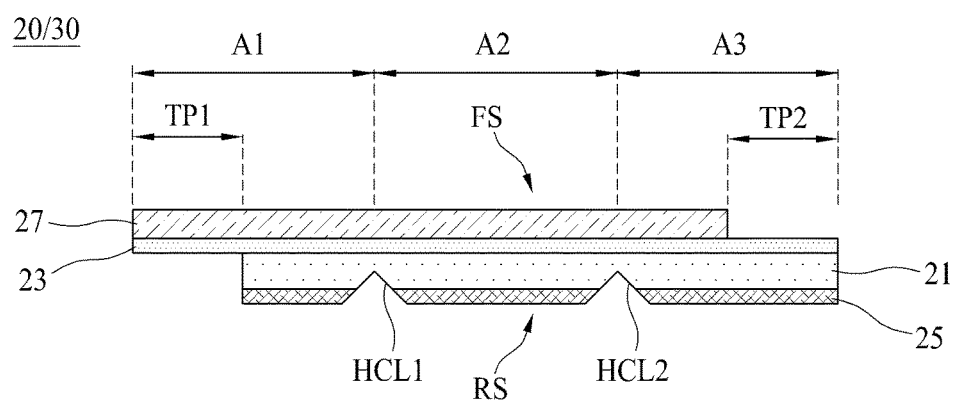
FIGS. 7 to 10 are diagrams for describing a cross-sectional views of a structure of a data routing film and a gate routing film illustrated in FIG. 1.

FIG. 7 is a diagram for describing a cross-sectional view of a structure of the data routing film and the gate routing film illustrated in FIG. 1.

Referring to FIG. 7 along with FIGS. 1 and 6, a data routing film 20 according to an embodiment may include a base film 21 and a line layer 23.

The base film 21 (or a base core) may be formed of a flexible material (for example, polyimide) so as to surround one edge of the display substrate 10 and to be closely adhered to the one edge. The base film 21, as illustrated in FIG. 6, may include first to third areas A1 to A3.

The line layer 23 may include a plurality of data routing lines DRL provided on a first surface FS of the base film 21. The line layer 23 may include one of conductive metals, such as copper (Cu), gold (Au), silver (Ag), aluminum (Al), nickel (Ni), and tin (Sn), or an alloy thereof. The line layer 23 may be directly formed on the base film 21, or may be manufactured as a sheet type and may be adhered to the base film 21 by using an adhesive member. Here, the first surface FS of the base film 21 may be defined as a front surface of the base film 21 opposite to an opposite surface directly facing the display substrate 10.

The data routing film 20 according to an embodiment may further include a light blocking layer 25.

The light blocking layer 25 may be provided all over a second surface RS of the base film 21 opposite to the first surface FS of the base film 21. Here, the second surface RS of the base film 21 may be defined as a rear surface of the base film 21 directly facing the display substrate 10. The light blocking layer 25 prevents side light leakage caused by light, traveling to an outermost side surface in the base plate 100, of light emitted from each subpixel SP. To this end, the light blocking layer 25 according to an embodiment may include a light absorbing material and may include a black matrix, black silicon, or a black tape.

The data routing film 20 according to an embodiment may further include an insulation layer 27.

The insulation layer 27 may be provided on the first surface FS of the base film 21 to cover the line layer 23. The insulation layer 27 according to an embodiment may include an insulating material such as polyimide. For example, the insulation layer 27 may be directly formed on the base film 21 to cover the line layer 23, or may be manufactured as a sheet type and may be adhered to the base film 21 by an adhesive member to cover the line layer 23. The insulation layer 27 electrically insulates the line layer 23 and prevents the line layer 23 from being damaged from an external impact.

Optionally, the data routing film 20 according to an embodiment may further include at least one first half cutting line HCL1, provided in a boundary portion between a first area A1 and a second area A2, and at least one second half cutting line HCL2 provided in a boundary portion between the second area A2 and a third area A3.

Each of the at least one first half cutting line HCL1 and the at least one second half cutting line HCL2 may be concavely provided in the base film 21 through the light blocking layer 25 to have a cross-sectional surface having a triangular shape, and a depth (or a height) thereof may be set to equal to or less than a sum of a thickness of the light blocking layer 25 and a half thickness of the base film 21.

The data routing film 20 according to an embodiment may include a first terminal TP1 and a second terminal TP2.

The first terminal TP1 may be provided by one edge of each of the plurality of data routing lines DRL exposed toward the rear surface of the base film 21 in the first area A1. To this end, one edge of the base film 21 and the light blocking layer 25 overlapping the one edge may be removed by a cutting process, and thus, the one edge of each of the plurality of data routing lines DRL may be exposed toward the rear surface of the base film 21 to act as the first terminal TP1 and, as illustrated in FIG. 4 or 5, may be electrically connected to the data pad part.

The second terminal TP2 may be provided by the other edge of each of the plurality of data routing lines DRL exposed toward the front surface of the base film 21 in the third area A3. To this end, the insulation layer 27 overlapping the other edge of the base film 21 may be removed by a cutting process, or the insulation layer 27 may be provided in an area other than the other edge of the base film 21. Therefore, the other edge of each of the plurality of data routing lines DRL may be exposed toward the front surface of the base film 21 to act as the second terminal TP2 and, as illustrated in FIG. 4, may be electrically connected to the first flexible printed circuit film 40.

A gate routing film 30 according to the present embodiment may be provided in the same structure as that of the above-described data routing film 20, one edge of each of the plurality of gate routing lines GRL acting as a first terminal TP1 may be electrically connected to the gate pad part GPP, and the other edge of each of the plurality of gate routing lines GRL acting as a second terminal TP2 may be electrically connected to the second flexible printed circuit film 50. Therefore, repetitive descriptions are omitted.

Figure 8:
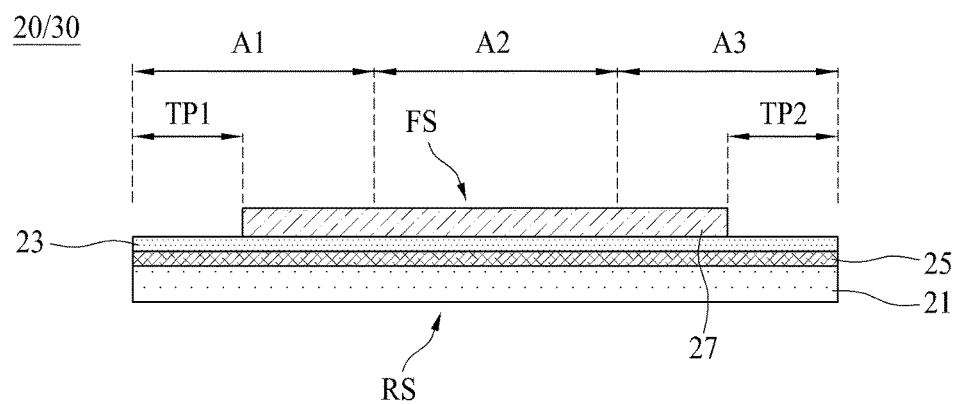

FIG. 8 is a diagram for describing a cross-sectional view of a structure of the data routing film and the gate routing film illustrated in FIG. 1 and illustrates an example where a layer structure in the routing film illustrated in FIG. 7 has been modified. Therefore, in the present embodiment, only a layer structure of a routing film will be described below.

Referring to FIG. 8 along with FIGS. 1, 6, and 7, a data routing film 20 according to an embodiment may include a base film 21, a light blocking layer 25 provided on a first surface FS of the base film 21, a line layer 23 provided on the light blocking layer 25, and an insulation layer 27 covering a portion of the line layer 23 other than one edge and the other edge of the line layer 23. Except that the light blocking layer 25 is provided between the first surface FS of the base film 21 and the line layer 23 and each of first and second terminals TP1 and TP2 is exposed to the first surface FS of the base film 21, the data routing film 20 according to the embodiment is the same as the data routing film illustrated in FIG. 7.

Therefore, one edge of each of the plurality of data routing lines DRL may be exposed toward a front surface of the base film 21 to act as the first terminal TP1 and, as illustrated in FIG. 4 or 5, may be electrically connected to the data pad part. Also, the other edge of each of the plurality of data routing lines DRL may be exposed toward the front surface of the base film 21 to act as the second terminal TP2 and, as illustrated in FIG. 5, may be electrically connected to the first flexible printed circuit film 40.

A gate routing film 30 according to the present embodiment may be provided in the same structure as that of the above-described data routing film 20, one edge of each of the plurality of gate routing lines GRL acting as a first terminal TP1 may be electrically connected to the gate pad part GPP, and the other edge of each of the plurality of gate routing lines GRL acting as a second terminal TP2 may be electrically connected to the second flexible printed circuit film 50. Therefore, repetitive descriptions are omitted.

Figure 9:
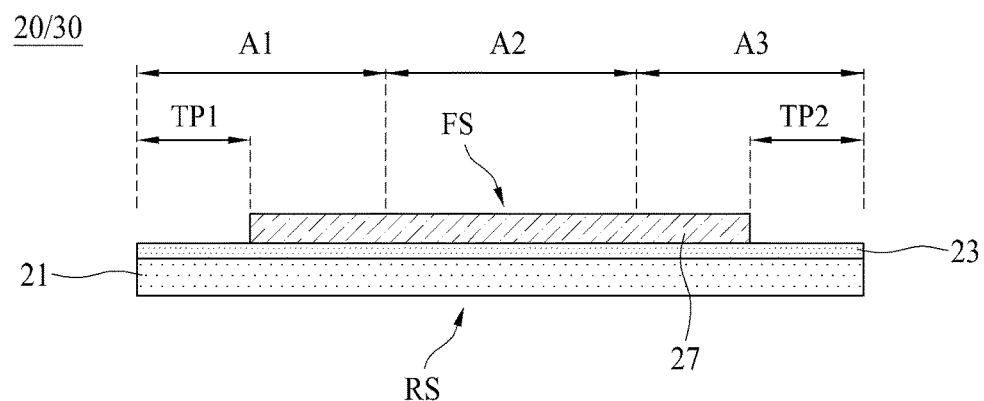

Optionally, the base film 21 according to the present embodiment may have a light blocking function. That is, as illustrated in FIG. 9, the base film 21 according to an embodiment may be formed of a flexible material including a light blocking material. For example, the base film 21 may include a base material and a black pigment, thereby having black. Each of the data routing film and the gate routing film including the base film 21 having black does not need a separate light blocking layer because the base film 21 itself has a light blocking function, and thus, the line layer 23 may be directly provided on the first surface FS of the base film 21.

Figure 10:
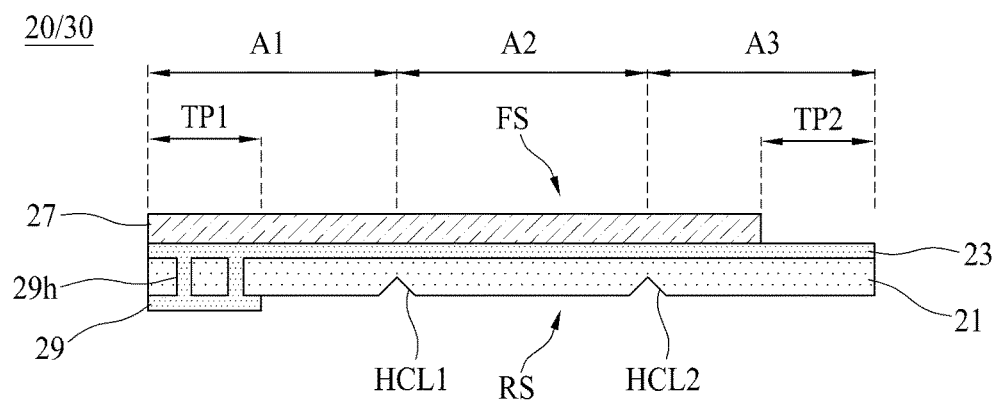

FIG. 10 is a diagram for describing a cross-sectional view of a structure of the data routing film and the gate routing film illustrated in FIG. 1 and illustrates an example where a structure of the first terminal in the routing film illustrated in FIG. 7 has been modified.

Referring to FIG. 10 along with FIGS. 1, 6, and 7, a data routing film 20 according to an embodiment may include a base film 21, a line layer 23, an insulation layer 27, a first terminal TP1, and a second terminal TP2.

The base film 21 may be formed of the above-described base film 21 having black, and thus, its repetitive description is omitted.

The line layer 23 may include the plurality of data routing lines DRL provided on the first surface FS of the base film 21.

The insulation layer 27 may be formed to cover a portion of the line layer 23 other than the other edge of the base film 21.

The first terminal TP1 may include a plurality of terminal patterns 29 that are provided on the second surface RS of the base film 21 overlapping a first area A1 of the base film 21 and respectively overlap one edges of the plurality of data routing lines DRL.

The plurality of terminal patterns 29 may be exposed toward a rear surface of the base film 21 and may be respectively connected to the plurality of data routing lines DRL through a plurality of via holes 29*h* provided in the base film 21. The first terminal TP1 (i.e., each of the plurality of terminal patterns 29), as illustrated in FIG. 4 or 5, may be electrically connected to the data pad part.

The second terminal TP2 may be provided by the other edge of each of the plurality of data routing lines DRL exposed by the insulation layer 27 in the other edge of the base film 21. Therefore, the other edge of each of the plurality of data routing lines DRL may be exposed toward the front surface of the base film 21 to act as the second terminal TP2 and, as illustrated in FIG. 4, may be electrically connected to the first flexible printed circuit film 40.

A gate routing film 30 according to the present embodiment may be provided in the same structure as that of the above-described data routing film 20, each terminal pattern 29 of a first terminal TP1 may be electrically connected to the gate pad part GPP, and the other edge of each of the plurality of gate routing lines GRL acting as a second terminal TP2 may be electrically connected to the second flexible printed circuit film 50. Therefore, repetitive descriptions are omitted.

In the data routing film and the gate routing film according to the present embodiment, the second terminal TP2 may be provided on the first surface of the base film 21, and the first terminal TP1 may be provided on the second surface of the base film 21. Accordingly, the data routing film and the gate routing film according to the present embodiment are easily connected to the pad part and the flexible printed circuit film provided on the display substrate 10.

Figure 11:
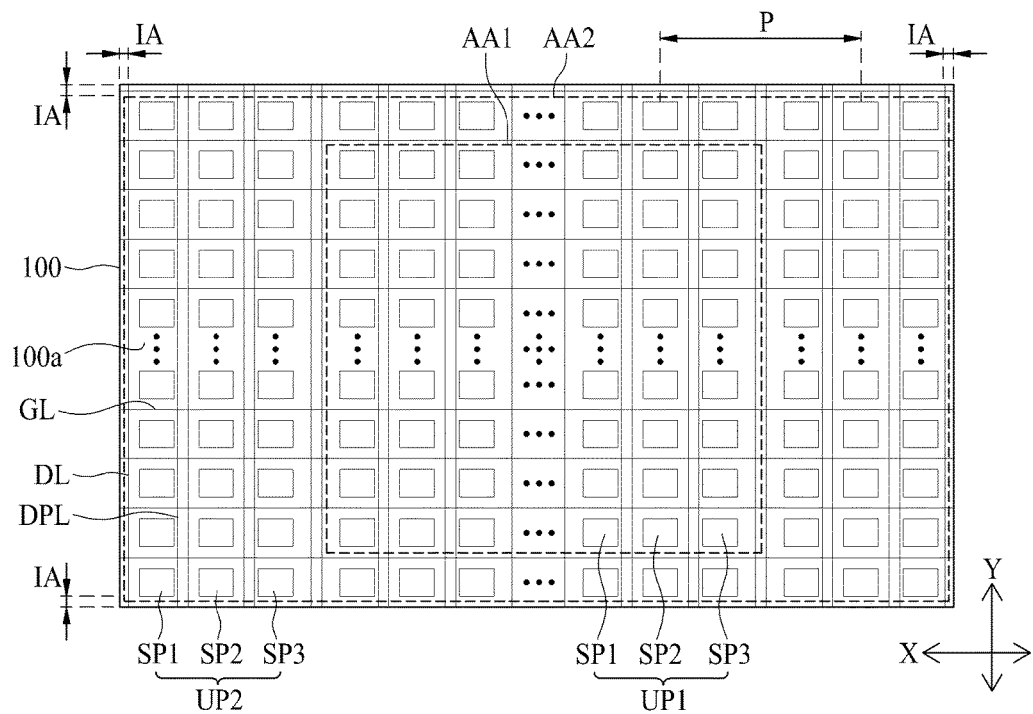
FIG. 11 is a plan view for describing a display substrate of a display device according to an embodiment of the present disclosure.

FIG. 11 is a plan view for describing a display substrate 10 of a display device according to an embodiment of the present disclosure.

Referring to FIG. 11, the display substrate 10 (i.e., a base plate 100) of the display device according to the present embodiment may include a first display area AA1, a second display area AA2, a bezel area BA(IA), a plurality of first unit pixels UP1, and a plurality of second unit pixels UP2.

The first display area AA1 may be defined as a center area other than an edge of the base plate 100. The second display area AA2 may be defined to surround the first display area AA1 and may overlap an edge of the base plate 100.

A non-display area IA may be provided between each side of the display substrate 10 and the second display area AA2, may have a relatively very narrow width, and may be defined as the bezel area BA.

The plurality of first unit pixels UP1 may be provided in the first display area AA1. In this case, the plurality of first unit pixels UP1 may be arranged at a predetermined first reference pixel pitch along a first horizontal axis direction X and at a predetermined second reference pixel pitch along a second horizontal axis direction Y in the first display area AA1. The first reference pixel pitch P may be defined as a distance between center portions of two first unit pixels UP1 which are adjacent to each other along the first horizontal axis direction X, and the second reference pixel pitch may be defined as a distance between center portions of two first unit pixels UP1 which are adjacent to each other along the second horizontal axis direction Y.

The plurality of second unit pixels UP2 may be provided in the second display area AA2. In this case, the second unit pixels UP2 may each have a size which is less than that of each of the first unit pixels UP1. That is, a distance between a center portion of each of the second unit pixels UP2 and an outer surface of the base plate 100 may be set to half or less of each of the reference pixel pitches.

Adjacent first unit pixel UP1 and second unit pixel UP2 may be provided to have a reference pixel pitch P. Therefore, in the display device according to the present embodiment, the plurality of first unit pixels UP1 provided on the base plate 100 of the display substrate 10 may have the same size and may be arranged at the same reference pixel pitch, and in this case, a size of each of a plurality of second unit pixels UP2 adjacent to the outer surface of the base plate 100 is reduced, whereby the display device has a bezel width suitable for minimizing a boundary portion between display devices coupled to each other in a multi-screen display device.

The plurality of first unit pixels UP1 and the plurality of second unit pixels UP2 may each include at least three adjacent subpixels SP1 to SP3. The subpixels SP1 to SP3 are as described above, and thus, their detailed descriptions are omitted.

In the display substrate 10 according to the present embodiment, a size of the second unit pixel UP2 provided in the second display area AA2 overlapping the edge of the base plate 100 may be set less than that of the first unit pixel UP1 provided in the first display area AA1 of the base plate 100, and thus, the display device has a bezel width suitable for minimizing a boundary portion between display devices coupled to each other in a multi-screen display device.

Figure 12:
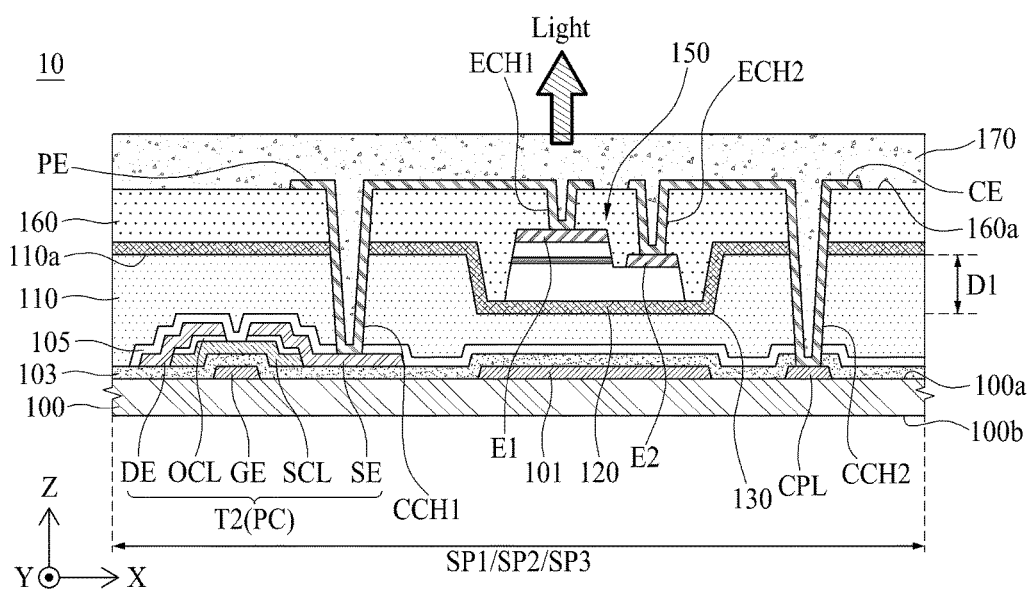
FIG. 12 is a cross-sectional view for describing a structure of one subpixel illustrated in FIG. 11.
Figure 13:
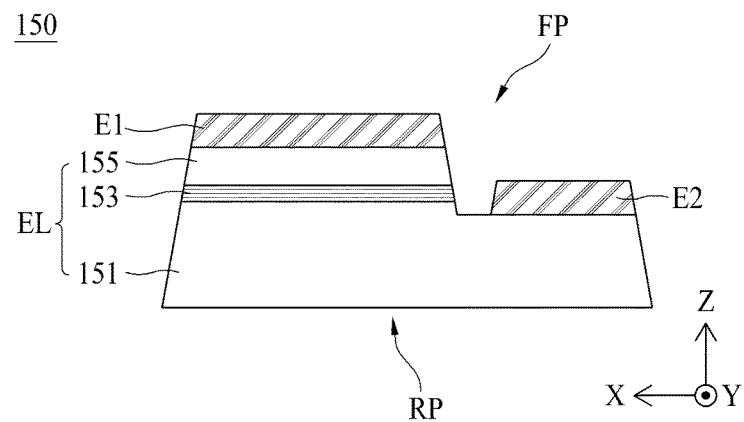
FIG. 13 is a cross-sectional view for describing a structure of a light emitting device illustrated in FIG. 12.

FIG. 12 is a cross-sectional view for describing a structure of one subpixel illustrated in FIG. 11, and FIG. 13 is a cross-sectional view for describing a structure of a light emitting device illustrated in FIG. 12.

Referring to FIGS. 12 and 13 along with FIG. 11, a plurality of subpixels SP1 to SP3 of a display substrate 10 according to the present embodiment may each include a pixel circuit PC, a passivation layer 110, a concave portion 130, a light emitting device 150, a planarization layer 160, a pixel electrode PE, and a common electrode CE.

First, in FIG. 12, a thickness of a base plate 100 is relatively thinly illustrated, but the base plate 100 may substantially have a thickness which is relatively much thicker than a total thickness of a layered structure provided on the base plate 100.

The pixel circuit PC may include a switching TFT T1, a driving TFT T2, and a capacitor Cst. The pixel circuit PC is as described above, and thus, its detailed description is not provided. Hereinafter, a structure of the driving TFT T2 will be described for example.

The driving TFT T2 may include a gate electrode GE, a semiconductor layer SCL, an ohmic contact layer OCL, a source electrode SE, and a drain electrode DE.

The gate electrode GE may be formed on the base plate 100 along with the gate line GL. The gate electrode GE may be covered by a gate insulation layer 103. The gate insulation layer 103 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 103 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. Here, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines DPL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line DPL.

In addition, the switching TFT T1 configuring the pixel circuit PC may be formed in a structure which is the same as that of the driving TFT T2. In this case, the gate electrode of the switching TFT T1 may branch or protrude from the gate line GL, the first electrode of the switching TFT T1 may branch or protrude from the data line DL, and the second electrode of the switching TFT T1 may be connected to the gate electrode GE of the driving TFT T2 through a via hole provided in the gate insulation layer 103.

The pixel circuit PC may be covered by an interlayer insulation layer 105. The interlayer insulation layer 105 may be provided all over the base plate 100 to cover the pixel circuit PC including the driving TFT T2. The interlayer insulation layer 105 according to an embodiment may be formed of an inorganic material, such as SiOx or SiNx, or an organic material such as benzocyclobutene or photo acryl. The interlayer insulation layer 105 may not be provided.

The passivation layer 110 may be provided all over the base plate 100 to cover a subpixel SP (i.e., the pixel circuit PC), or may be provided all over the base plate 100 to cover the interlayer insulation layer 105. The passivation layer 110 may protect the pixel circuit PC and may provide a planar surface on the interlayer insulation layer 105. The passivation layer 110 according to an embodiment may be formed of an organic material such as benzocyclobutene or photo acryl, and particularly, may be formed of photo acryl for convenience of a process.

The concave portion 130 may be provided in an emissive area of a subpixel area defined in the subpixel SP and may accommodate the light emitting device 150. The concave portion 130 according to an embodiment may be concavely provided to have a certain depth D1 from the passivation layer 110. In this case, the concave portion 130 may include an accommodating space which is provided concavely from a top 110a of the passivation layer 110 to have a depth D1 corresponding to a thickness (or a total height) of the light emitting device 150. Here, a floor surface of the concave portion 130 may be formed by removing a portion of the passivation layer 110, a whole portion of the passivation layer 110, the whole portion of the passivation layer 110 and a portion of the interlayer insulation layer 105, or a whole portion of each of the passivation layer 110, the interlayer insulation layer 105, and the gate insulation layer 103 in order to have the depth D1 which is set based on the thickness of the light emitting device 150. For example, the concave portion 130 may be provided to have a depth of 2 μm to 6 μm from the top 110a of the passivation layer 110. The concave portion 130 may have a groove or cup shape having a size of the floor surface which is wider than a rear surface (or a bottom) of the light emitting device 150.

The concave portion 130 according to an embodiment may include an inclined surface provided between the floor surface of the concave portion 130 and the top 110a of the passivation layer 110, and the inclined surface may allow light emitted from the light emitting device 150 to travel toward the front of concave portion 130.

The light emitting device 150 may be mounted on the concave portion 130 and may be electrically connected to the pixel circuit PC and a common power line CPL, and thus, may emit light with a current flowing from the pixel circuit PC (i.e., the driving TFT T2) to the common power line CPL. The light emitting device 150 according to an embodiment may include a light emitting layer EL, a first electrode (or an anode terminal) E1, and a second electrode (or a cathode terminal) E2.

The light emitting layer EL may emit light according to a recombination of an electron and a hole based on a current flowing between the first electrode E1 and the second electrode E2. The light emitting layer EL according to an embodiment may include a first semiconductor layer 151, an active layer 153, and a second semiconductor layer 155.

The first semiconductor layer 151 may supply an electron to the active layer 153. The first semiconductor layer 151 according to an embodiment may be formed of an n-GaN-based semiconductor material, and examples of the n-GaN-based semiconductor material may include GaN, AlGaN, InGaN, AlInGaN, etc. Here, silicon (Si), germanium (Ge), selenium (Se), tellurium (Te), or carbon (C) may be used as impurities used for doping of the first semiconductor layer 151.

The active layer 153 may be provided on one side of the first semiconductor layer 151. The active layer 153 may have a multi quantum well (MQW) structure which includes a well layer and a barrier layer which is higher in band gap than the well layer. The active layer 153 according to an embodiment may have an MQW structure of InGaN/GaN or the like.

The second semiconductor layer 155 may be provided on the active layer 153 and may supply a hole to the active layer 153. The second semiconductor layer 155 according to an embodiment may be formed of a p-GaN-based semiconductor material, and examples of the p-GaN-based semiconductor material may include GaN, AlGaN, InGaN, AlInGaN, etc. Here, magnesium (Mg), zinc (Zn), or beryllium (Be) may be used as impurities used for doping of the second semiconductor layer 155.

The first electrode E1 may be provided on the second semiconductor layer 155. The first electrode E1 may be connected to the source electrode SE of the driving TFT T2.

The second electrode E2 may be provided on the other side of the first semiconductor layer 151 and may be electrically disconnected from the active layer 153 and the second semiconductor layer 155. The second electrode E2 may be connected to the common power line CPL.

Each of the first and second electrodes E1 and E2 according to an embodiment may be formed of a material including one or more materials of a metal material, such as gold (Au), tungsten (W), platinum (Pt), iridium (Ir), silver (Ag), copper (Cu), nickel (Ni), titanium (Ti), or chromium (Cr), and an alloy thereof. In other embodiments, each of the first and second electrodes E1 and E2 may be formed of a transparent conductive material, and examples of the transparent conductive material may include indium tin oxide (ITO), indium zinc oxide (IZO), etc. However, the present embodiment is not limited thereto.

In addition, the first semiconductor layer 151, the active layer 153, and the second semiconductor layer 155 may be provided in a structure of being sequentially stacked on a semiconductor substrate. Here, the semiconductor substrate may include a semiconductor material included in a sapphire substrate or a silicon substrate. The semiconductor substrate may be used as a growth semiconductor substrate for growing each of the first semiconductor layer 151, the active layer 153, and the second semiconductor layer 155, and then, may be separated from the first semiconductor layer 151 through a substrate separation process. Here, the substrate separation process may be a laser lift-off process or a chemical lift-off process. Therefore, since the growth semiconductor substrate is removed from the light emitting device 150, the light emitting device 150 has a thin thickness, and thus, may be accommodated into the concave portion 130 provided in each subpixel SP.

The light emitting device 150 may emit the light according to the recombination of the electron and the hole based on the current flowing between the first electrode E1 and the second electrode E2. In this case, the light emitted from the light emitting device 150 may pass through the first and second electrodes E1 and E2 and may be output to the outside. In other words, the light emitted from the light emitting device 150 may pass through the first and second electrodes E1 and E2 and may be output in a second direction opposite to a first direction toward the floor surface of the concave portion 130, thereby displaying an image.

The light emitting device 150 may include a first portion (or a front portion) FP, including the first and second electrodes E1 and E2 connected to the pixel circuit PC, and a second portion (or a rear portion) RP opposite to the first portion FP. In this case, the first portion FP may be disposed relatively farther away from the floor surface of the concave portion 130 than the second portion RP. Here, the first portion FP may have a size which is less than that of the second portion RP, and in this case, the light emitting device 150 may have a cross-sectional surface having a trapezoid shape which includes a top corresponding to the first portion FP and a bottom corresponding to the second portion RP.

The planarization layer 160 may be provided on the passivation layer 110 to cover the light emitting device 150. That is, the planarization layer 160 may be provided on the passivation layer 110 to have a thickness which enables the planarization layer 160 to cover a top of the passivation layer 110 and a front surface of the other accommodating space of the concave portion 130 into which the light emitting device 150 is accommodated.

The planarization layer 160 may provide a planar surface on the passivation layer 110. Also, the planarization layer 160 may be buried into the other accommodating space of the concave portion 130 into which the light emitting device 150 is accommodated, thereby fixing a position of the light emitting device 150.

The pixel electrode PE may electrically connect the first electrode E1 of the light emitting device 150 to the source electrode SE of the driving TFT T2 and may be defined as an anode electrode. The pixel electrode PE according to an embodiment may be provided on a top 160a of the planarization layer 160 overlapping the driving TFT T2 and the first electrode E1 of the light emitting device 150. The pixel electrode PE may be electrically connected to the source electrode SE of the driving TFT T2 through a first circuit contact hole CCH1 which is provided to pass through the interlayer insulation layer 105, the passivation layer 110, and the planarization layer 160, and may be electrically connected to the first electrode E1 of the light emitting device 150 through a first electrode contact hole ECH1 provided in the planarization layer 160. Therefore, the first electrode E1 of the light emitting device 150 may be electrically connected to the source electrode SE of the driving TFT T2 through the pixel electrode PE. If the display device has a top emission structure, the pixel electrode PE may be formed of a transparent conductive material, and if the display device has a bottom emission structure, the pixel electrode PE may be formed of a light reflection conductive material. Here, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. The pixel electrode PE including the light reflection conductive material may be formed of a single layer including the light reflection conductive material or a multilayer including a plurality of the single layers which are stacked.

The common electrode CE may be electrically connected to the second electrode E2 of the light emitting device 150 and the common power line CPL and may be defined as a cathode electrode. The common electrode CE may be provided on the top 160a of the planarization layer 160 overlapping the second electrode E2 of the light emitting device 150 and the common power line CPL. Here, the common electrode CE may be formed of a material which is the same as that of the pixel electrode PE.

One side of the common electrode CE according to an embodiment may be electrically connected to the common power line CPL through a second circuit contact hole CCH2 which is provided to pass through the gate insulation layer 103, the interlayer insulation layer 105, the passivation layer 110, and the planarization layer 160 overlapping the common power line CPL. The other side of the common electrode CE may be electrically connected to the second electrode E2 of the light emitting device 150 through a second electrode contact hole ECH2 which is provided in the planarization layer 160 to overlap the second electrode E2 of the light emitting device 150. Therefore, the second electrode E2 of the light emitting device 150 may be electrically connected to the common power line CPL through the common electrode CE.

The pixel electrode PE and the common electrode CE according to an embodiment may be simultaneously provided through an electrode patterning process using a deposition process of depositing an electrode material on the planarization layer 160 including the first and second circuit contact holes CCH1 and CCH2 and the first and second electrode contact holes ECH1 and ECH2, a lithography process, and an etching process. Therefore, in the present embodiment, since the common electrode CE and the pixel electrode PE connecting the light emitting device 150 and the pixel circuit PC are simultaneously formed, an electrode connection process is simplified, and a process time taken in a process of connecting the light emitting device 150 and the pixel circuit PC is considerably shortened, thereby enhancing a productivity of the light emitting diode display device.

The display device according to the present embodiment may further include a transparent buffer layer 170.

The transparent buffer layer 170 may be provided on the base plate 100 to cover a whole portion of the planarization layer 160 where the pixel electrode PE and the common electrode CE are provided, and thus, may provide a planar surface on the planarization layer 160, thereby protecting the light emitting device 150 and the pixel circuit PC from an external impact. Therefore, the pixel electrode PE and the common electrode CE may be provided between the planarization layer 160 and the transparent buffer layer 170. The transparent buffer layer 170 may be an optical clear adhesive (OCA) or an optical clear resin (OCR), but is not limited thereto.

The display device according to the present embodiment may further include a reflective layer 101 provided under an emissive area of each subpixel SP.

The reflective layer 101 may be provided between the floor surface of the concave portion 130 and the base plate 100 to overlap the emissive area including the light emitting device 150. The reflective layer 101 according to an embodiment may be formed of a material which is the same as that of the gate electrode GE of the driving TFT T2, and may be provided on the same layer as the gate electrode GE. The reflective layer 101 may reflect light, which is incident from the light emitting device 150, toward the first portion FP of the light emitting device 150. Accordingly, the display device according to the present embodiment may include the reflective layer 101, and thus, may have a top emission structure. However, if the display device according to the present embodiment has a bottom emission structure, the reflective layer 101 may be omitted.

Optionally, the reflective layer 101 may be formed of a material which is the same as that of the source/drain electrode SE/DE of the driving TFT T2, and may be provided on the same layer as the source/drain electrode SE/DE.

In the display device according to the present embodiment, the light emitting device 150 included in each subpixel SP may be adhered to the floor surface of a corresponding concave portion 130 by an adhesive member 120.

The adhesive member 120 may be disposed between the concave portion 130 of each subpixel SP and the light emitting device 150 and may attach the light emitting device 150 on the floor surface of the concave portion 130, thereby primarily fixing the light emitting device 150.

The adhesive member 120 according to an embodiment may be attached (coated) on the second portion RP of the light emitting device 150 (i.e., a back surface of the first semiconductor layer 151), and thus, in a mounting process of mounting the light emitting device 150 onto the concave portion 130, the adhesive member 120 may be adhered to the concave portion 130 of each subpixel SP.

In other embodiments, the adhesive member 120 may be dotted onto the concave portion 130 of each subpixel SP and may be spread by pressure which is applied thereto in a mounting process performed for the light emitting device 150, and thus, may be adhered to the second portion RP of the light emitting device 150. Therefore, the light emitting device 150 mounted on the concave portion 130 may be primarily position-fixed by the adhesive member 120. Accordingly, according to the present embodiment, the mounting process for the light emitting device 150 may be performed in a method of simply attaching the light emitting device 150 on the floor surface of the concave portion 130, and thus, a mounting process time taken in performing the mounting process for the light emitting device 150 is shortened.

In other embodiments, the adhesive member 120 may be coated on the top 110a of the passivation layer 110 and the floor surface and an inclined surface of the concave portion 130. That is, the adhesive member 120 may be provided to wholly cover a portion of a front surface of the passivation layer 110 except the contact holes. In other words, the adhesive member 120 may be disposed between the passivation layer 110 and the planarization layer 160 and may be disposed between the passivation layer 110 and the light emitting device 150. In other embodiments, the adhesive member 120 may be coated on the whole top 110a of the passivation layer 110, where the concave portion 130 is provided, to have a certain thickness. A portion of the adhesive member 120 coated on the top 110a of the passivation layer 110, where the contact holes are to be provided, may be removed when forming the contact holes. Therefore, in the present embodiment, immediately before a mounting process for the light emitting device 150, the adhesive member 120 may be coated on the whole top 110a of the passivation layer 110 to have a certain thickness, and thus, according to the present embodiment, a process time taken in forming the adhesive member 120 is shortened.

In the present embodiment, the adhesive member 120 may be provided on the whole top 110a of the passivation layer 110, and thus, the planarization layer 160 according to the present embodiment is provided to cover the adhesive member 120.

The display device according to the present embodiment provides the same effects as those of the above-described display device, and since the light emitting device 150 is accommodated into the concave portion 130 provided in each of the subpixels SP1 to SP3, alignment precision is enhanced in the mounting (or transfer) process for the light emitting device 150, thereby enhancing productivity.

Figure 14:
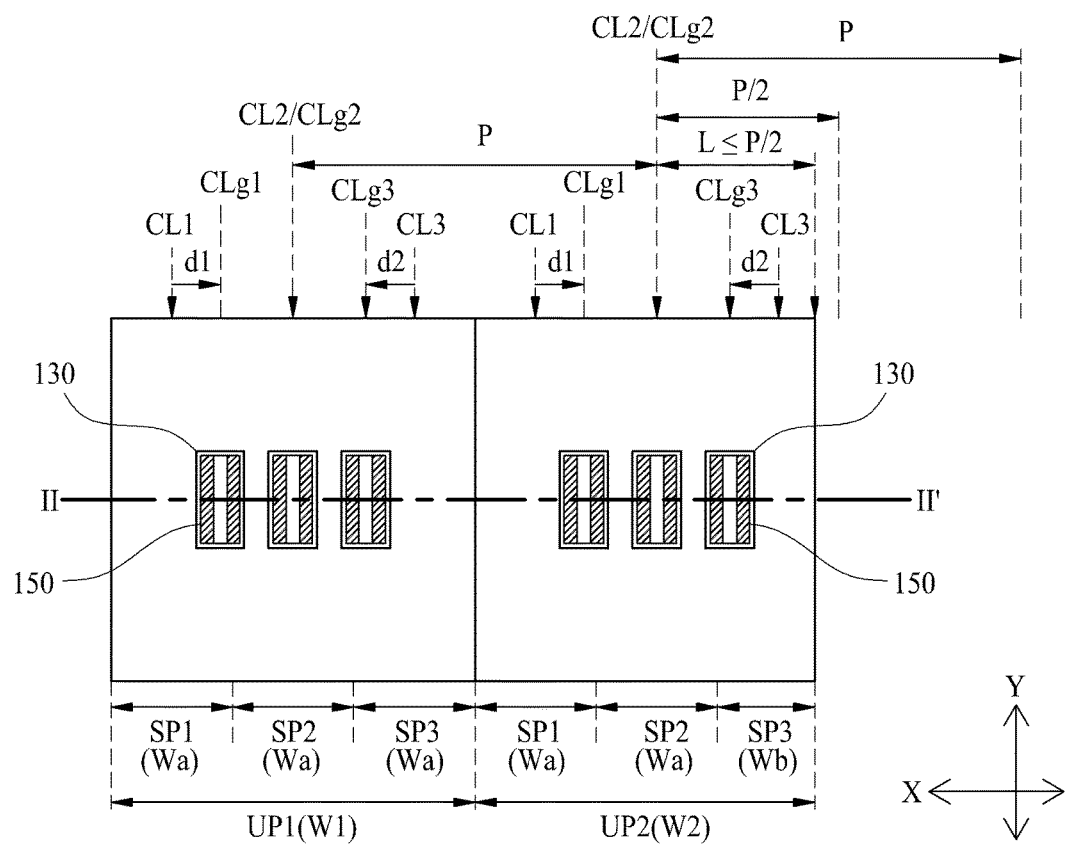
FIG. 14 is a plan view for describing a concave portion provided in a unit pixel according to an embodiment of the present disclosure.
Figure 15:
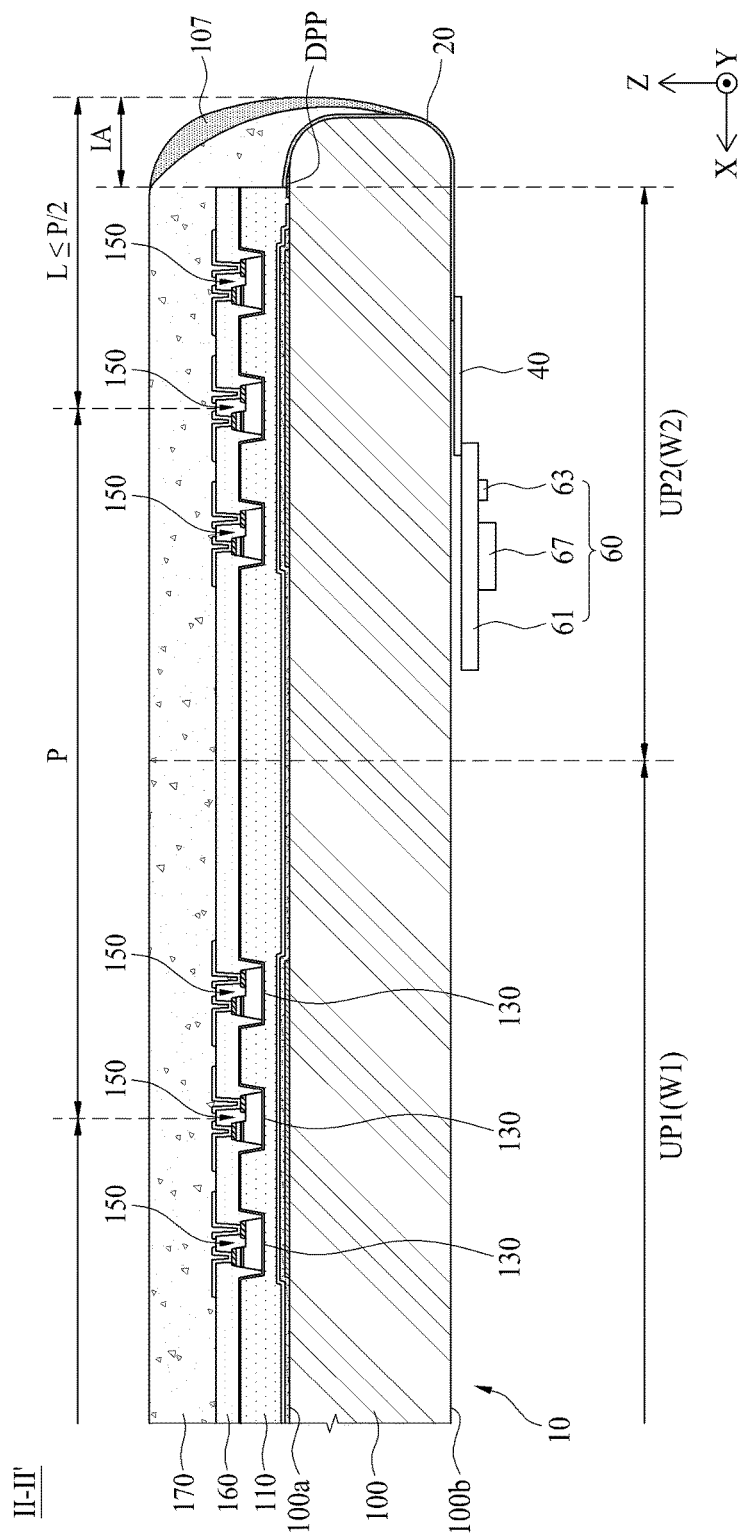
FIG. 15 is a cross-sectional view taken along line II-II' illustrated in FIG. 14.

FIG. 14 is a plan view for describing a concave portion provided in a unit pixel according to an embodiment of the present disclosure, and FIG. 15 is a cross-sectional view taken along line II-II' illustrated in FIG. 14.

Referring to FIGS. 14 and 15, in the present embodiment, first to third subpixels SP1 to SP3 configuring each of a plurality of first unit pixels UP1 may each include a concave portion 130 which is provided concavely from a top of a passivation layer 110.

First, in each of the first unit pixels UP1, the second subpixel SP2 may be provided in the middle of a unit pixel area, the first subpixel SP1 may be provided on one side of the second subpixel SP2, and the third subpixel SP3 may be provided on the other side of the second subpixel SP2.

The concave portion 130 provided in the second subpixel SP2 may be two-dimensionally tetragonal in shape, and a center line CLg2 of the concave portion 130 with respect to a first horizontal axis direction X may match a second center line CL2 of the second subpixel SP2. For example, the concave portion 130 of the second subpixel SP2 may be provided in a center portion of the first unit pixel UP1. Therefore, a distance L between a center portion of the concave portion 130 provided in the second subpixel SP2 and an outer surface of a base plate 100 may be set to half "P/2" or less of a reference pixel pitch P.

The concave portion 130 provided in the first subpixel SP1 may be two-dimensionally tetragonal in shape and may be provided close to the concave portion 130 provided in the second subpixel SP2. That is, a center line CLg1 of the concave portion 130 provided in the first subpixel SP1 with respect to the first horizontal axis direction X may be provided at a position which is spaced apart from a center line CL1 of the first subpixel SP1 by a first distance d1 in a direction toward the second subpixel SP2.

The concave portion 130 provided in the third subpixel SP3 may be two-dimensionally tetragonal in shape and may be provided close to the concave portion 130 provided in the second subpixel SP2. That is, a center line CLg3 of the concave portion 130 provided in the third subpixel SP3 with respect to the first horizontal axis direction X may be provided at a position which is spaced apart from a center line CL3 of the third subpixel SP3 by a second distance d2 in a direction toward the second subpixel SP2.

The first to third subpixels SP1 to SP3 of each of the first unit pixels UP1 may have the same width Wa with respect to the first horizontal axis direction X.

In each of the first unit pixels UP1, the concave portions 130 respectively provided in the first to third subpixels SP1 to SP3 may be provided to concentrate on a center portion of the first unit pixel UP1. Each first unit pixel UP1 may have a first width W1 corresponding to a predetermined resolution, and the plurality of first unit pixels UP1 may be arranged at the reference pixel pitch P. Here, the reference pixel pitch P may be defined as a distance between center portions of two first unit pixels UP1 which are adjacent to each other with respect to the first horizontal axis direction X. In other words, the reference pixel pitch P may be defined as a distance between the same subpixels provided in two first unit pixels UP1 which are adjacent to each other with respect to the first horizontal axis direction X. That is, the reference pixel pitch P may be defined as a distance between light emitting devices 150 respectively provided in second subpixels SP2 of two adjacent first unit pixels UP1. For example, the first unit pixel UP1 may be configured with a red subpixel SP1, a green subpixel SP2, and a blue subpixel SP3, and in this case, the reference pixel pitch P may be a distance between concave portions 130 (or light emitting devices 150) respectively provided in adjacent red subpixels SP1, a distance between concave portions 130 (or light emitting devices 150) respectively provided in adjacent green subpixels SP2, or a distance between concave portions 130 (or light emitting devices 150) respectively provided in adjacent blue subpixels SP3, with respect to the first horizontal axis direction X.

In each of the plurality of second unit pixels UP2, the second subpixel SP2 may be provided in the middle of a unit pixel area, the first subpixel SP1 may be provided on one side of the second subpixel SP2, and the third subpixel SP3 may be provided on the other side of the second subpixel SP2 and may be provided adjacent to the outer surface of the base plate 100. Here, the outer surface of the base plate 100 may be defined as a side wall vertical to an end of a front surface 100a of the base plate 100, or may be defined as an outermost surface of the base plate 100 exposed to the outside. That is, the side wall of the base plate 100 may be directly exposed to the outside, or may be covered by structures such as a routing line, a passivation layer, etc. and thus may not be directly exposed to the outside. Therefore, the outer surface of the base plate 100 may be defined as the outermost surface of the base plate 100 exposed to the outside.

The concave portions 130 respectively provided in the first to third subpixels SP1 to SP3 in each second unit pixel UP2 are the same as the concave portions of the first unit pixels UP1, and thus, their repetitive descriptions are not provided.

In each of the second unit pixels UP2, since each of the first and second subpixels SP1 and SP2 is adjacent to a corresponding first unit pixel UP1, each of the first and second subpixels SP1 and SP2 may be provided to have the width Wa which is the same as that of each of subpixels of the corresponding first unit pixel UP1.

On the other hand, the third subpixel SP3 of each second unit pixel UP2 may be provided to have a width Wb which is narrower than the width Wa of each of the first and second subpixels SP1 and SP2. In detail, in each second unit pixel UP2, the concave portions 130 may be provided to concentrate on center portions of unit pixels, and thus, even when a portion of an area of the third subpixel SP3 adjacent to the non-display area IA of the base plate 100 is removed, the quality of an image displayed on a corresponding unit pixel UP2 is not affected. In other words, the light emitting device 150 may be configured with a micro light emitting diode chip having a size which is relatively smaller than that of a subpixel area, and thus, even when the light emitting device 150 is disposed close to one side in the subpixel area, the quality of an image displayed on a corresponding unit pixel UP2 is not affected. Therefore, the width Wb of the third subpixel SP3 with respect to the first horizontal axis direction X may be reduced by the second distance d2 at which the light emitting device 150 mounted on the third subpixel SP3 is disposed close to the second subpixel SP2 with respect to the center line CL3 of the third subpixel SP3. In this case, a maximum distance L between the second unit pixel UP2 and the outer surface of the base plate 100 may be set to half "P/2" or less of the reference pixel pitch P at which the plurality of first unit pixels UP1 are arranged, namely, may be set equal to or less than half of the reference pixel pitch P. Therefore, since a size of each of the third subpixels SP3 is reduced in the second unit pixels UP2 adjacent to a bezel area of the base plate 100, the display device according to the present embodiment has a bezel width suitable for minimizing a boundary portion between display devices connected to each other in a multi-screen display device.

In addition, the display device according to an embodiment of the present disclosure may further include a side sealing member 107.

The side sealing member 107 may be provided to cover the outer surface of the base plate 100, a side surface of the transparent buffer layer 170, and an outer surface of the routing film 20. The side sealing member 107 according to an embodiment may be formed of a silicon-based or UV curing-based sealant (or resin), but considering a process tack time, the side sealing member 107 may be formed of a UV curing-based sealant. Also, the side sealing member 107 may have a color (for example, blue, red, green, or black), or may be formed of a colored resin or a light blocking resin for preventing side light leakage without being limited thereto. The side sealing member 107 prevents side light leakage while light emitted from the light emitting device 150 of each subpixel SP travels in a direction from the inside of the transparent buffer layer 170 to an outermost surface, and buffers an external impact to prevent a side surface of each of the base plate 100 and the transparent buffer layer 170 from being damaged by the external impact.

Figure 16:
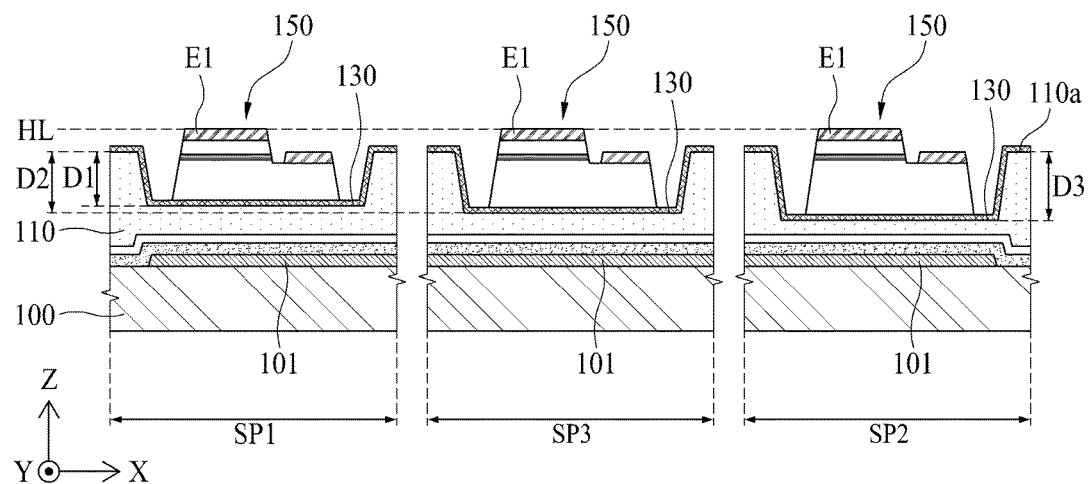
FIG. 16 is a cross-sectional view and FIG. 17 is a plan view for describing a modification embodiment of a concave portion according to an embodiment of the present disclosure.

FIG. 16 is a cross-sectional view for describing a modification embodiment of a concave portion according to an embodiment of the present disclosure.

Referring to FIG. 16, a plurality of concave portions 130 respectively provided in a plurality of subpixels SP1 to SP3 of each of a plurality unit pixels UP1 and UP2 according to the modification embodiment may have the same shapes and may be formed concavely from a passivation layer 110 to have different depths D1 to D3 in respective subpixels SP.

The concave portions 130 according to an embodiment may be provided to have the different depths D1 to D3 from the top 110a of the passivation layer 110, based on a height of a light emitting device 150 which is to be provided in a corresponding subpixel, thereby removing or minimizing a height deviation (or a step height) between light emitting devices by colors.

In order to realize a color image, the display device according to the present embodiment may include a red subpixel SP1, a green subpixel SP2, and a blue subpixel SP3, and the light emitting device 150 may be provided by colors and may be disposed in the concave portion 130 provided in a subpixel having a corresponding color. In this case, the color-based light emitting devices 150 may have different heights (or thicknesses) due to a process error of a manufacturing process. For example, thicknesses of the color-based light emitting devices 150 may be thickened in the order of red, green, and blue. In this case, the depths D1 to D3 of the concave portions 130 may be progressively deeply provided in the order of the red subpixel SP1, the green subpixel SP2, and the blue subpixel SP3, based on a height of a corresponding light emitting device 150.

Therefore, in the present embodiment, the depths of the concave portions 130 provided in respective subpixels may be differently set based on a height (or a thickness) of the light emitting device 150 which is to be provided in a corresponding subpixel, and thus, uppermost surfaces (for example, tops of first electrodes E1) of the color-based light emitting devices 150 disposed in respective subpixels may be disposed on the same horizontal line HL, thereby preventing an open defect, where first electrodes (or second electrodes) of the color-based light emitting devices 150 are not exposed, from occurring due to a thickness deviation between the color-based light emitting devices 150 in a patterning process for first and second electrode contact holes. Also, in the present embodiment, in the top emission structure, an optical distance between a reflective layer 101 and the color-based light emitting devices 150 of each subpixel is optimized by using the concave portions 130 which are provided to the different depths D1 to D3 in respective subpixels, and thus, a reflection efficiency of the reflective layer 101 is improved, thereby maximizing a light efficiency of each of the light emitting devices.

Figure 17:
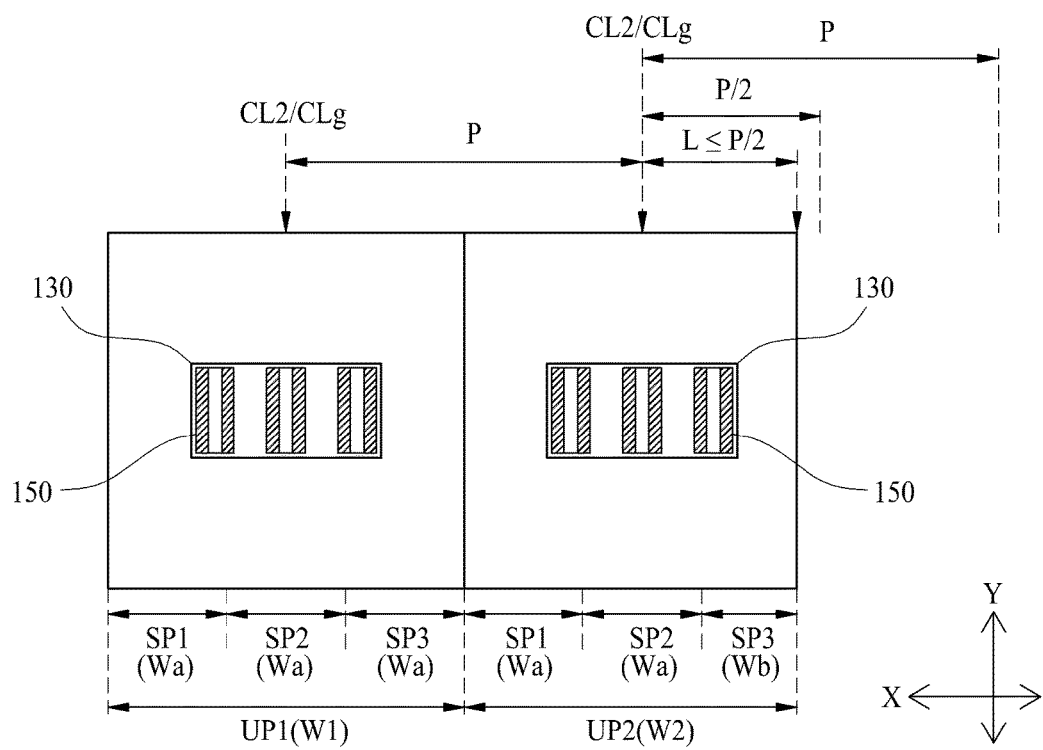

FIG. 17 is a plan view for describing a modification embodiment of a concave portion according to an embodiment of the present disclosure.

Referring to FIG. 17, in the present embodiment, a plurality of concave portions 130 respectively provided in a plurality of subpixels SP1 to SP3 of each of a plurality of unit pixels UP1 and UP2 may communicate with each other without a boundary portion and may include one accommodating space. That is, each of a plurality of first unit pixels UP1 and each of a plurality of second unit pixels UP2 may include only one concave portion 130 provided all over first to third subpixels SP1 to SP3.

The concave portion 130 may have a tetragonal shape which extends toward the first subpixel SP1 and the third subpixel SP3 with respect to a center portion of each of the unit pixels UP1 and UP2 or a center line CL2 of the second subpixel SP2. That is, a center line CLg of the concave portion 130 may match the center line CL2 of the second subpixels SP2 with respect to the first horizontal axis direction X.

As described above, in the present embodiment, since the one concave portion 130 is provided in the unit pixels UP1 and UP2, deviation of the light emitting device 150 is prevented in a mounting process for the light emitting device 150 corresponding to each of the subpixels SP1 to SP3, and an alignment precision of the light emitting device 150 is enhanced.

Figure 18:
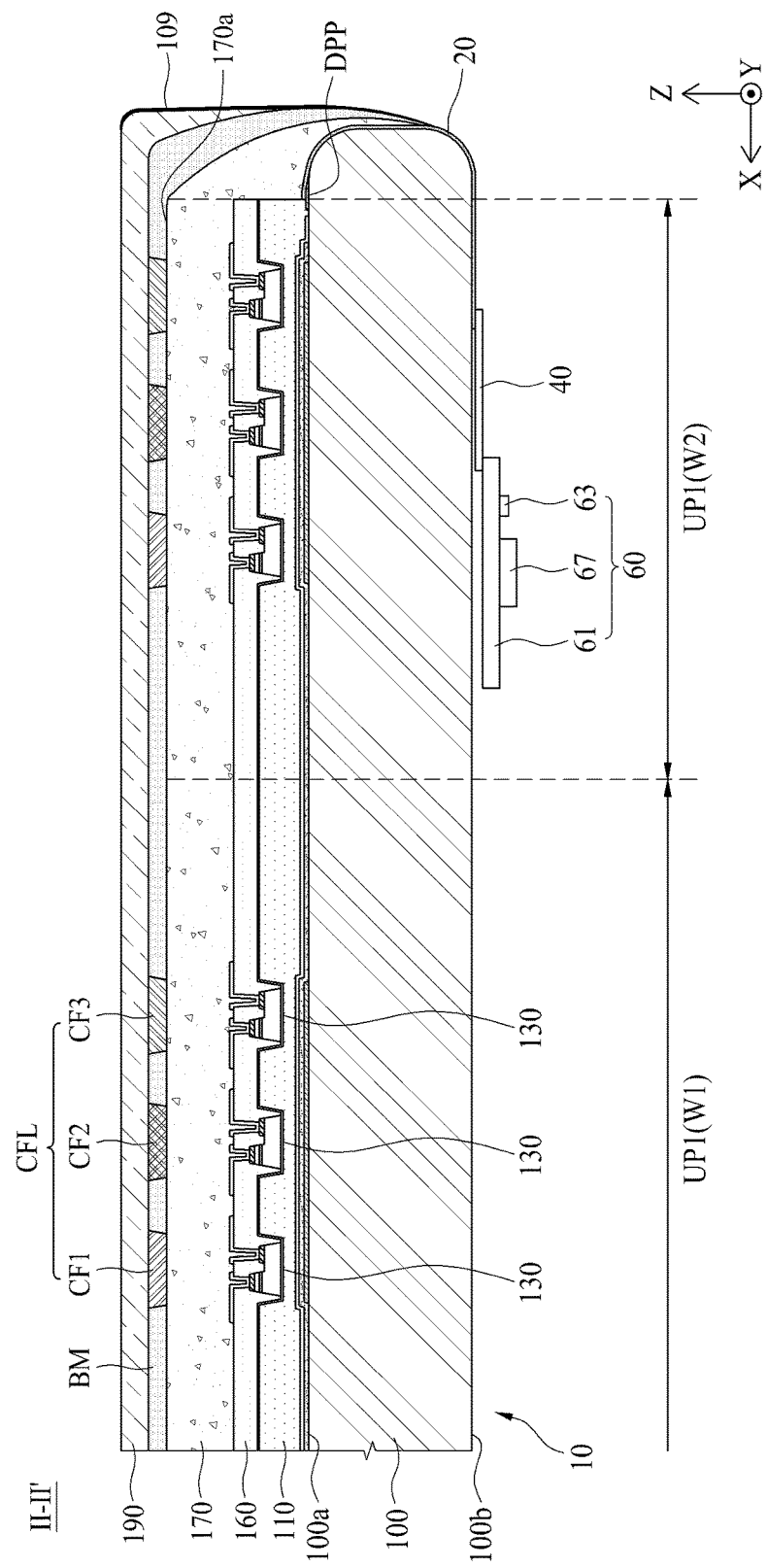
FIGS. 18 and 19 are other cross-sectional views taken along line II-II' illustrated in FIG. 14.

FIG. 18 is another cross-sectional view taken along line II-II' illustrated in FIG. 14 and illustrates an example where a color filter is added to the display device illustrated in FIG. 15. Hereinafter, therefore, only an element added to the display device according to an embodiment of the present disclosure will be described.

Referring to FIG. 18 along with FIG. 15, the display device according to the present embodiment may further include a black matrix BM and a color filter layer CFL.

First, a light emitting device 150 provided in each of a plurality of subpixels SP1 to SP3 may emit white light. That is, all the light emitting devices 150 provided on a base plate 100 may be white light emitting devices emitting white light.

The black matrix BM may define an opening area of each of the subpixels SP1 to SP 3 and may be directly provided on a top 170a of a transparent buffer layer 170 which overlaps the light emitting device 150 of each of the subpixels SP1 to SP3 in a one-to-one relationship, thereby preventing color mixture between adjacent subpixels SP1 to SP3. The black matrix BM may include a light absorbing material.

Optionally, the black matrix BM may be provided to cover side surface of the transparent buffer layer 170 and an outer surface of the base plate 100. In this case, the black matrix BM prevents side light leakage while light emitted from the light emitting device 150 of each of the subpixels SP1 to SP3 travels in a direction from the inside of the transparent buffer layer 170 to an outermost surface.

The color filter layer CFL may be directly formed on the top 170a of the transparent buffer layer 170 overlapping the opening area defined by the black matrix BM and may include a red color filter CF1, a green color filter CF2, and a blue color filter CF3 corresponding to respective colors defined in the plurality of subpixels SP1 to SP3. The color filter layer CFL may transmit only light, having a wavelength of a color corresponding to a corresponding subpixel SP, of the white light emitted from each of the subpixels SP1 to SP3.

In addition, the display device according to the present embodiment may further include a cover layer 190.

The cover layer 190 may be provided on the base plate 100 to cover the black matrix BM and the color filter layer CFL. The cover layer 190 according to an embodiment may be formed of a material having a relatively low refractive index. For example, the cover layer 190 may be formed of LiF, $MgF_2$, $CaF_2$, $ScF_3$, and/or the like and may have a multi-layer structure having different refractive indexes. The cover layer 190 may be provided on the base plate 100 to cover the black matrix BM and the color filter layer CFL, thereby protecting each of the subpixels SP1 to SP3 and efficiently outputting light, emitted from a light emitting device 150 of each of the subpixels SP1 to SP3, to the outside.

Optionally, the display device according to the present embodiment may further include a side coating layer 109.

The side coating layer 109 may be provided to cover an outer surface of the cover layer 190. The side coating layer 109 according to an embodiment may be provided to cover the outer surface of the cover layer 190 through a coating process using a black ink including a black-based light absorbing material. Furthermore, the side coating layer 109 may be additionally provided on the outer surface of the base plate 100 and a side surface of the black matrix BM. The side coating layer 109 prevents side light leakage while light emitted from the light emitting device 150 of each of the subpixels SP1 to SP3 travels in a direction from the inside of the cover layer 190 to an outermost surface.

The cover layer 190 may be replaced with a transparent substrate including a glass material or a transparent plastic material, and in this case, the transparent substrate may be adhered to the black matrix BM and the color filter layer CFL by using a transparent adhesive member. Furthermore, the black matrix BM and the color filter layer CFL may be provided on the transparent substrate without being directly be formed on the top 170a of the transparent buffer layer 170, and in this case, the transparent substrate including the black matrix BM and the color filter layer CFL may be adhered to the top 170a of the transparent buffer layer 170 by using the transparent adhesive member.

As described above, in the present embodiment, since the light emitting devices 150 having the same color are respectively mounted on the subpixels SP1 to SP3, a mounting process for the light emitting devices 150 may be performed without differentiating light emitting devices by colors, thereby shortening a mounting process time taken in the mounting process for the light emitting devices.

Figure 19:
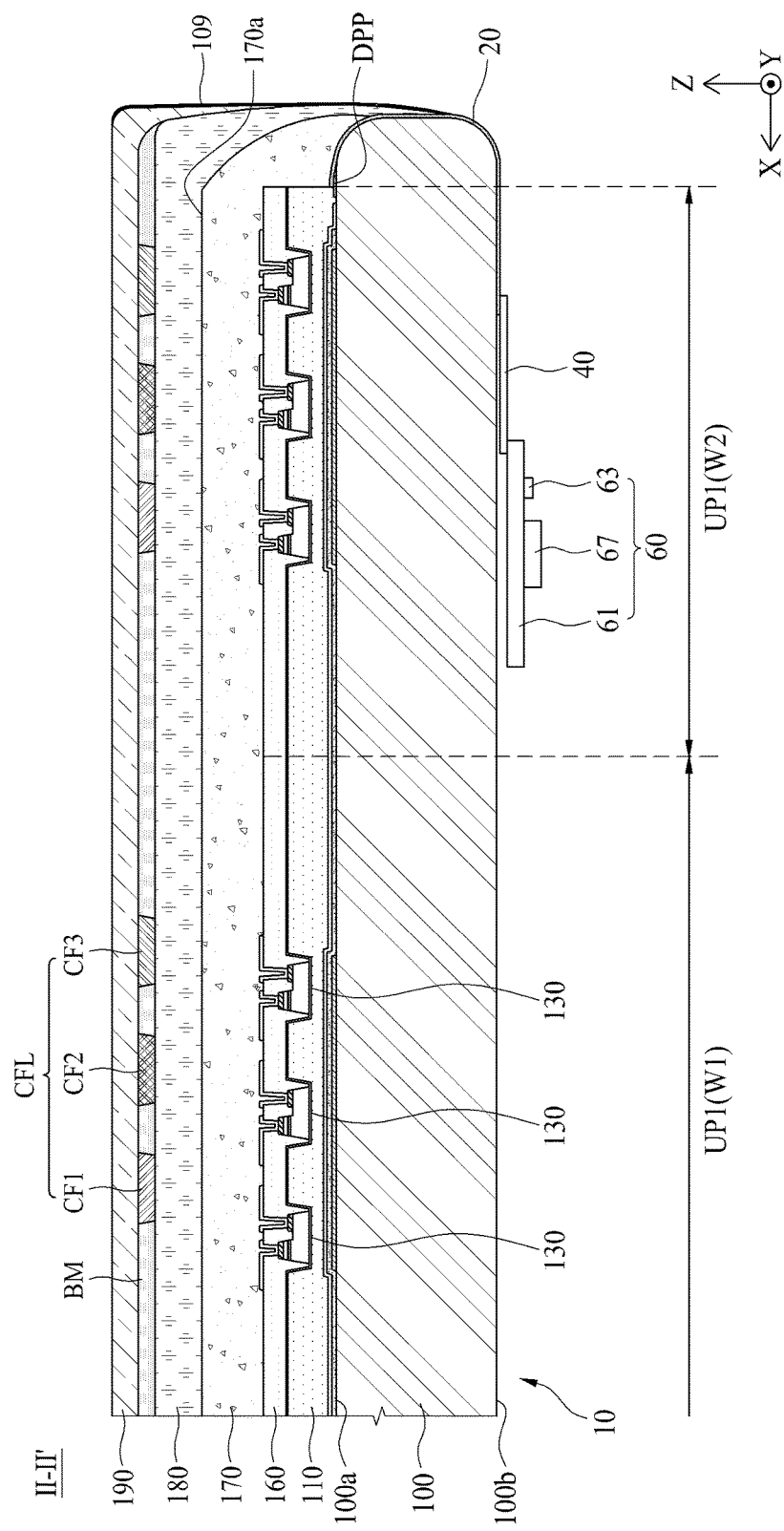

FIG. 19 is another cross-sectional view taken along line II-II' illustrated in FIG. 14 and illustrates an example where a wavelength conversion layer is added to the display device illustrated in FIG. 18. Hereinafter, therefore, the wavelength conversion layer and elements relevant thereto will be described.

Referring to FIG. 19, in the display device according to the present embodiment, if a light emitting device 150 emitting light of a first color except white is identically disposed in each of a plurality of subpixels SP1 to SP3, a wavelength conversion layer 180 may be provided on a top of a transparent buffer layer 170, for realizing colors through a plurality of unit subpixels UP1 and UP2. That is, the wavelength conversion layer 180 may be provided between the color filter layer CFL and the transparent buffer layer 170.

The wavelength conversion layer 180 may emit light of a second color, based on the light of the first color incident from the light emitting device 150 of each of the subpixels SP1 to SP3. That is, the wavelength conversion layer 180 may absorb the light of the first color and may emit the light of the second color through re-emission. Here, the light of the first color may be blue light, and the light of the second color may be yellow light.

For example, the wavelength conversion layer 180 may be directly coated on a top 170a of the transparent buffer layer 170 in a liquid state, and then, may be cured by a curing process using heat and/or light. As another example, the wavelength conversion layer 180 may be manufactured in a sheet type and may be directly adhered to the top 170a of the transparent buffer layer 170.

The wavelength conversion layer 180 according to an embodiment may include a phosphor or a quantum dot.

The phosphor according to an embodiment may be a yellow phosphor which is excited by blue light to emit yellow light, and for example, may be an yttrium aluminum garnet (YAG)-based material.

The quantum dot according to an embodiment may be excited by blue light to emit yellow light and may have a size for emitting light having a yellow wavelength, and for example, may include CdS, CdSe, CdTe, ZnS, ZnSe, GaAs, GaP, GaAs—P, Ga—Sb, InAs, InP, InSb, AlAs, AlP, AlSb, and/or the like.

The light of the second color, which is re-emitted from the wavelength conversion layer 180 according to the present embodiment and is irradiated onto a cover layer 190, may be combined with the light of the first color irradiated onto the cover layer 190 without being re-emitted from the wavelength conversion layer 180, and thus, may be converted into white light. The white light may be filtered by a color filter overlapping each of the subpixels SP1 to SP3, and thus, may be emitted as color light corresponding to each of the subpixels SP1 to SP3.

Except that the black matrix BM and the color filter layer CFL are provided on a top of the wavelength conversion layer 180, the black matrix BM and the color filter layer CFL are the same as FIG. 18, and thus, their detailed descriptions are not repeated.

As described above, in the present embodiment, since the light emitting devices 150 having the same color are respectively mounted on the subpixels SP1 to SP3, a mounting process for the light emitting devices 150 may be performed without differentiating light emitting devices by colors, thereby shortening a mounting process time taken in the mounting process for the light emitting devices.

The cover layer 190 may be replaced with a transparent substrate including a glass material or a transparent plastic material, and in this case, the transparent substrate may be adhered to the wavelength conversion layer 180 by using a transparent adhesive member. Furthermore, the wavelength conversion layer 180 may be provided on the transparent substrate including the black matrix BM and the color filter layer CFL without being directly be formed on a top 170a of the transparent buffer layer 170, and in this case, the transparent substrate may be adhered to the top 170a of the transparent buffer layer 170 by using the transparent adhesive member.

In the display device according to the embodiments of the present disclosure, a light emitting display device (i.e., a micro light emitting diode display device including a subpixel including the light emitting device) has been described above as an example, but the technical features of the line substrate according to the embodiments of the present disclosure may be identically applied to all flat panel display devices such as LCD devices, organic light emitting display devices, and quantum dot display devices, in addition to the micro light emitting diode display device.

Figure 20:
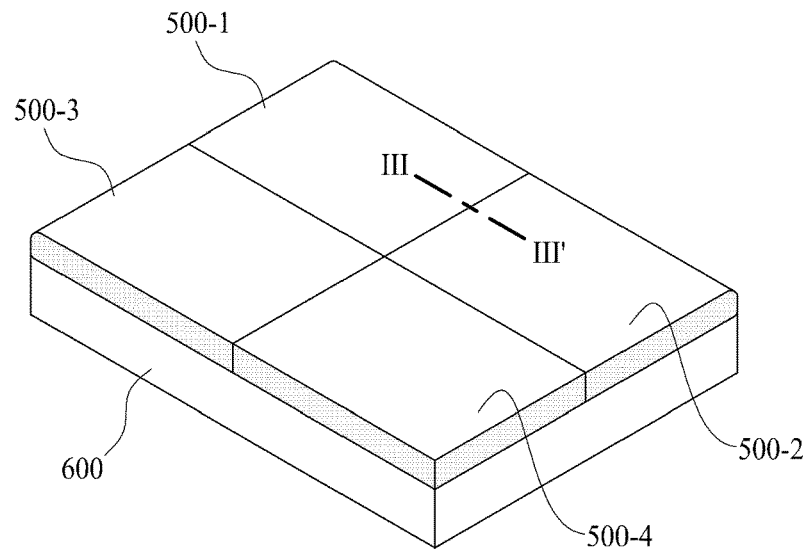
FIG. 20 is an isometric view for describing a multi-screen display device according to an embodiment of the present disclosure.
Figure 21:
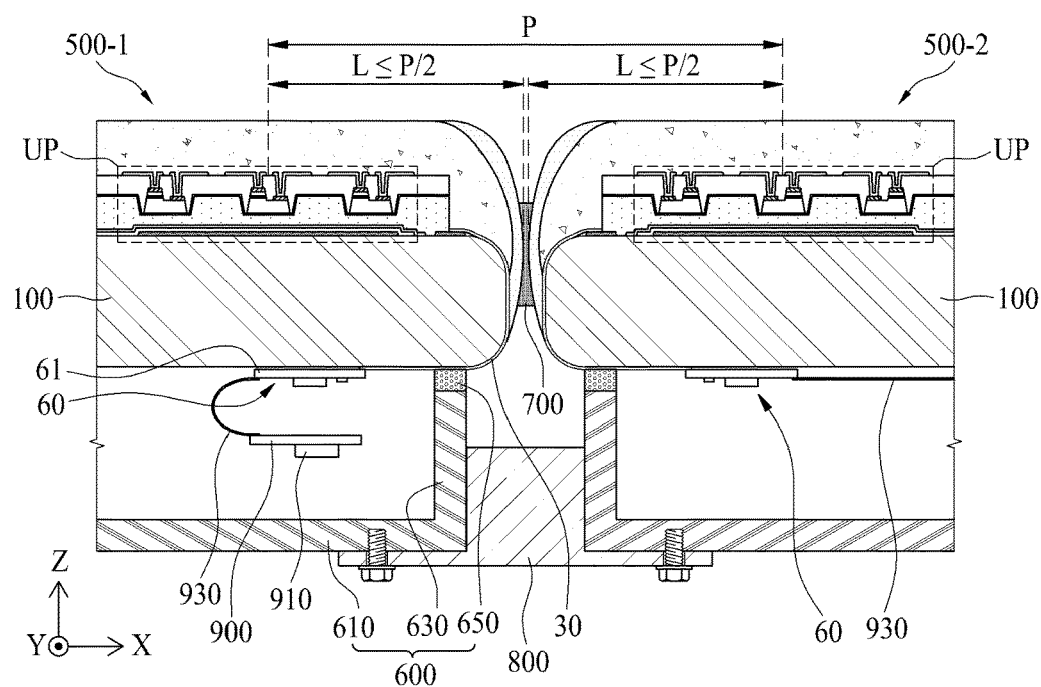
FIG. 21 is a cross-sectional view taken along line III-III' illustrated in FIG. 20.

FIG. 20 is an isometric view for describing a multi-screen display device according to an embodiment of the present disclosure, and FIG. 21 is a cross-sectional view taken along line III-III' illustrated in FIG. 20.

Referring to FIGS. 20 and 21 along with FIG. 15, the multi-screen display device according to the present embodiment may include a plurality of screen modules 500-1 to 500-4 and a housing 600.

The plurality of screen modules 500-1 to 500-4 may be arranged in an N×M form (where N is a positive integer equal to or more than two, and M is a positive integer equal to or more than two) to respectively display individual images or divisionally display one image. The plurality of screen modules 500-1 to 500-4 may each include the display device according to the embodiments of the present disclosure illustrated in FIGS. 1 to 17, and a repetitive description on the display device is not provided.

Side surfaces of the plurality of screen modules 500-1 to 500-4 according to an embodiment may be coupled to each other by a module coupling member 700 provided on the outer surface of the base plate 100. The module coupling member 700 may couple the side surfaces of two adjacent screen modules of the plurality of screen modules 500-1 to 500-4 arranged in a lattice form, thereby implementing the multi-screen display device. The module coupling member 700 according to an embodiment may be formed of an adhesive or a double-sided tape which enables a relatively thin thickness, for minimizing a space between two adjacent screen modules of the plurality of screen modules 500-1 to 500-4.

In each of the plurality of screen modules 500-1 to 500-4, a maximum distance L between the second unit pixel UP2 and the outer surface of the display substrate 10 may be half "P/2" or less of the reference pixel pitch P at which the plurality of first unit pixels UP1 are arranged. Therefore, a maximum distance between second unit pixels UP2 of two adjacent screen modules of which side surfaces are coupled to each other with the module coupling member 700 therebetween may be equal to or less than the reference pixel pitch P. In other words, a pixel pitch between the second unit pixels UP2 of two adjacent screen modules may be equal to or less than the reference pixel pitch P at which the first unit pixels UP1 respectively provided in the plurality of screen modules 500-1 to 500-4 are arranged. Therefore, in the present embodiment, an area where a dark portion caused by a boundary portion between two adjacent screen modules of the screen modules 500-1 to 500-4 occurs is minimized or removed, and thus, an image where a sense of discontinuity of a whole screen is minimized may be displayed.

The housing 600 may support a rear edge of each of the plurality of screen modules 500-1 to 500-4 and may cover a rear surface of the plurality of screen modules 500-1 to 500-4. The housing 600 according to an embodiment may include a housing plate 610, covering the rear surface of each of the plurality of screen modules 500-1 to 500-4, and a housing side wall 630 which is provided vertical to the housing plate 610 and supports the rear edge of each of the plurality of screen modules 500-1 to 500-4.

The housing plate 610 according to an embodiment may be configured as one body covering the whole rear surface of each of the plurality of screen modules 500-1 to 500-4.

The housing plate 610 according to an embodiment may be configured with a plurality of division plates to overlap the rear surface of each of the plurality of screen modules 500-1 to 500-4.

The housing side wall 630 may be installed vertical to a top of the housing plate 610 overlapping the rear edge of each of the plurality of screen modules 500-1 to 500-4 and may individually support the rear edge of each of the plurality of screen modules 500-1 to 500-4. In this case, the housing side wall 630 may support the rear edge of each of the plurality of screen modules 500-1 to 500-4 through a module supporting member 650. Here, the module supporting member 650 may be an elastic member, a foam pad, a double-sided tape, or the like.

In addition, the housing 600 may include a plurality of module housings including the housing plate 610 and the housing side wall 630. Each of the plurality of module housings may individually support the rear edges of the plurality of screen modules 500-1 to 500-4 and may cover the rear surfaces of the plurality of screen modules 500-1 to 500-4. In this case, the housing 600 may include a housing coupling member 800 provided between the plurality of module housings. The housing coupling member 800 may be inserted into a space between adjacent module housings and may be fixed to the housing plate 610 of each of adjacent module housings by a fastening member such as a bolt, a screw, and/or the like.

In addition, the multi-screen display device according to the present embodiment may further include an integration control board 900 and an image signal generator 910 mounted on the integration control board 900.

The integration control board 900 may be disposed in an accommodating space provided on the rear surface of each of the plurality of screen modules 500-1 to 500-4 by the housing 600. The integration control board 900 may be connected to a PCB 61 of a display driving circuit unit 60 of each of the plurality of screen modules 500-1 to 500-4 through at least one signal cable 930.

The image signal generator 910 may be mounted on the integration control board 900. The image signal generator 910 may receive a raw image signal supplied from an external host driving system and may generate a module-based input image signal corresponding to each of images which are to be respectively displayed by display devices of the plurality of screen modules 500-1 to 500-4, based on the received raw image signal. That is, the image signal generator 910 may receive all resolution information, including a first display area AA1 and a second display area AA2, about each of the plurality of screen modules 500-1 to 500-4, divide the raw image signal according to the resolution information about each module to generate the module-based input image signal, and supply the module-based input image signal to a corresponding screen module of the plurality of screen modules 500-1 to 500-4. Therefore, each of the plurality of screen modules 500-1 to 500-4 may display a module-based image corresponding to module-based panel image data, based on the input image signal supplied from the image signal generator 910.

As described above, since the multi-screen display device according to the present embodiment includes the screen modules 500-1 to 500-4 configured with the display device according to the embodiments of the present disclosure, an area where a dark portion caused by a boundary portion between two adjacent screen modules of the screen modules 500-1 to 500-4 occurs is minimized or removed, and thus, an image where a sense of discontinuity of a whole screen is minimized may be displayed.

Figure 22A:
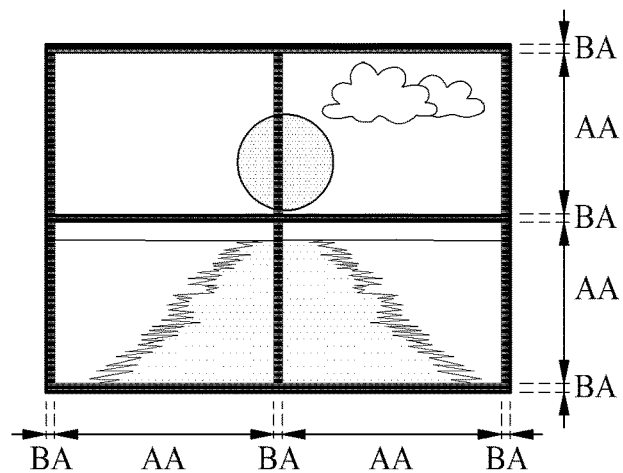
FIG. 22A is a multi-screen display device of the related art.

FIG. 22A is a multi-screen display device of the related art.

Figure 22B:
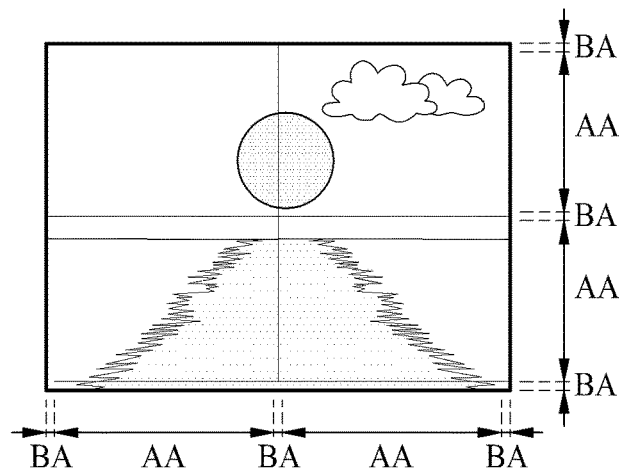
FIG. 22B is a multi-screen display device according to an embodiment of the present disclosure.

FIG. 22B is a multi-screen display device according to an embodiment of the present disclosure.

First, referring to FIG. 22A, in the related art multi-screen display device, since an image is displayed on only a display area AA of each of a plurality of display devices, it can be seen that due to a bezel area BA based on a front case of each of the plurality of display devices, a dark portion occurs in a boundary portion between display devices coupled to each other, and a disconnected image caused by the dark portion of the boundary portion is displayed on a whole screen.

On the other hand, referring to FIG. 22B, in the multi-screen display device according to the embodiments of the present disclosure, since a pixel pitch between second unit pixels of two adjacent screen modules of which side surfaces are coupled to each other is equal to or less than a reference pixel pitch of a first unit pixel, it can be seen that an area where a dark portion caused by a boundary portion between a plurality of screen modules occurs is minimized or removed, and thus, an image where a sense of discontinuity of a whole screen is minimized is displayed.

As a result, even in a case where side surfaces of a plurality of screen modules are coupled to each other in a lattice form, the multi-screen display device according to the embodiments of the present disclosure may display one image where a sense of discontinuity of a whole screen is minimized, thereby enhancing a degree of viewing immersion of a user for an image displayed on a large-size screen.

As described above, in the display device according to the embodiments of the present disclosure, an increase in a bezel area is minimized by a routing film attached on a pad part provided in a front edge of a display substrate, and the display device has a bezel area suitable for minimizing a boundary portion between display devices coupled to each other in a multi-screen display device.

In the display device according to the embodiments of the present disclosure, a dark portion occurrence area caused by a boundary portion provided between screen modules is minimized or removed, thereby displaying an image where a sense of discontinuity of a whole screen is minimized.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a display substrate including a plurality of subpixels, respectively provided in a plurality of pixel areas defined by a plurality of data lines and a plurality of gate lines, and a data pad part connected to each of the plurality of data lines in a one-to-one relationship, each subpixel including:
a passivation layer,
a light emitting device on the passivation layer,
a pixel electrode, and
a common electrode;
a planarization layer covering the passivation layer and the light emitting device;
a data routing film adhered to the data pad part, the data routing film including a plurality of data routing lines respectively connected to the plurality of data lines;
wherein the data routing film has a first area physically adhered to a portion of the data pad part, a second area physically adhered to a first side of the display substrate, and a third area physically adhered to a rear surface of the display substrate overlapping the data pad part; and
wherein the planarization layer is positioned between the pixel electrodes and the passivation layer and between the common electrodes and the passivation layer.

2. The display device of claim 1, wherein the data routing film further comprises a light blocking layer.

3. The display device of claim 1, further comprising: a gate routing film including a plurality of gate routing lines respectively connected to the plurality of gate lines,
wherein
the display substrate further comprises a gate pad part connected to each of the plurality of gate lines in a one-to-one relationship, and
the gate routing film having a first area adhered to the display substrate to cover a portion of the gate pad part, a second area adhered to a second side of the display substrate, the second side of the display substrate orthogonal to the first side, and a third area adhered to the rear surface of the display substrate, the first area of the gate routing film opposite the third area on the display substrate.

4. The display device of claim 3, wherein the gate routing film further comprises a light blocking layer.

5. The display device of claim 3, wherein a corner of the display substrate surrounded by each of the data routing film and the gate routing film is chamfered by a certain angle or a certain length.

6. The display device of claim 3, wherein each of the data routing film and the gate routing film comprises:
the first area having a first width; and
the second area having a second width different from the first width.

7. The display device of claim 6, wherein the second width is progressively narrowed in a direction from the first area to the third area.

8. The display device of claim 6, further comprising:
a first flexible printed circuit film adhered to the third area of the data routing film;
a second flexible printed circuit film adhered to the third area of the gate routing film; and
a display driving circuit unit connected to the first flexible printed circuit film and the second flexible printed circuit film.

9. The display device of claim 6, wherein each of the data routing film and the gate routing film further comprises:
at least one first half cutting line provided in a boundary portion between the first area and the second area, and at least one second half cutting line provided in a boundary portion between the second area and the third area, wherein at least one first half cutting line is concavely provided in the data routing film or the gate routing film, and at least one second half cutting line is concavely provided in the data routing film or the gate routing film.

10. The display device of claim 6, wherein
the data pad part includes a plurality of data pads, the first width of the first area of the data routing film is set to equal to or more than a length between a first data pad connected to a first data line and a last data pad connected to a last data line and to less than a long side length of the display substrate parallel to a lengthwise direction of the gate lines.

11. The display device of claim 6, wherein
the gate pad part includes a plurality of gate pads, the first width of the first area of the gate routing film is set to equal to or more than a length between a first gate pad connected to a first gate line and a last gate pad connected to a last gate line and to less than a short side length of the display substrate parallel to a lengthwise direction of the data lines.

12. The display device of claim 3, wherein each of the data routing film and the gate routing film comprises:
a base film including a flexible material; and
a line layer including a plurality of routing lines provided on a first surface of the base film.

13. The display device of claim 12, wherein each of the data routing film and the gate routing film further comprises a light blocking layer provided between the first surface of the base film and the line layer, or provided on a second surface opposite to the first surface of the base film.

14. The display device of claim 12, wherein the base film is black colored.

15. The display device of claim 14, wherein
each of the data routing film and the gate routing film further comprises a plurality of terminal patterns provided on a second surface opposite to the first surface of the base film to overlap an edge of each of the plurality of routing lines, and
the plurality of terminal patterns are respectively connected to the plurality of routing lines through a plurality of via holes provided in the base film.

16. The display device of claim 12, wherein each of the data routing film and the gate routing film further comprises:
an insulation layer which is provided on the first surface of the base film to cover the line layer.

17. The display device of claim 16, wherein
the insulation layer is provided in an area other than an edge of the base film.

18. The display device of claim 3, wherein
the display substrate includes a base plate, the gate routing film is bent in a shape matching one edge of the base plate and is adhered to the one edge of the base plate.

19. The display device of claim 1, wherein the display substrate further comprises:
a first display area and a second display area surrounding the first display area;
a plurality of first unit pixels provided in the first display area, each first unit pixel including a first group of subpixels of the plurality of subpixels; and
a plurality of second unit pixels provided in the second display area overlapping an edge of the display substrate, each second unit pixel including a second group of subpixels of the plurality of subpixels and having a size less than a size of each of the first unit pixels.

20. The display device of claim 19, wherein
the plurality of first unit pixels are arranged at a reference pixel pitch, and
a distance between a center of each of the plurality of second unit pixels and an outer surface of the display substrate is equal to or less than half of the reference pixel pitch.

21. The display device of claim 19, wherein
the first group of subpixels of the plurality of first unit pixels and the second group of subpixels of the plurality of second unit pixels each comprise first to third subpixels, and the first to third subpixels each comprise:
a pixel circuit connected to a corresponding data line and a corresponding gate line, the pixel circuit including a driving thin film transistor (TFT),
the passivation layer covering the pixel circuit;
a concave portion provided in the passivation layer to accommodate the light emitting device including a first electrode and a second electrode,
the pixel electrode electrically connecting the driving TFT to the first electrode of the light emitting device, and
the common electrode connected to the second electrode of the light emitting device.

22. The display device of claim 21, wherein
the concave portion of the second subpixel is provided in a center of a corresponding unit pixel, and
each of the concave portion of the first subpixel and the concave portion of the third subpixel is provided close to the concave portion of the second subpixel with respect to a center of a corresponding subpixel area.

23. The display device of claim 21, wherein in each of the plurality of second unit pixels, a distance between a center of each of the plurality of second unit pixels and an outer surface of the display substrate is equal to or less than half of a reference pixel pitch.

24. The display device of claim 21, further comprising:
a transparent buffer layer covering the planarization layer,
wherein the planarization layer covers the light emitting device accommodated into the concave portion; and
wherein each of the pixel electrode and the common electrode is provided between the planarization layer and the transparent buffer layer.

25. The display device of claim 24, further comprising: a color filter provided on the transparent buffer layer to overlap the light emitting device accommodated into the concave portion,
wherein the light emitting device emits white light.

26. The display device of claim 25, further comprising: a wavelength conversion layer provided between the transparent buffer layer and the color filter, the wavelength conversion layer including a phosphor or a quantum dot.

27. The display device of claim 21, wherein
the concave portion has a size of a floor surface which is wider than a rear surface of the light emitting device.

28. The display device of claim 21, wherein
the concave portion includes an inclined surface provided between a floor surface of the concave portion and a top of the passivation layer.

29. The display device of claim 21, wherein
the light emitting device includes a first portion, including the first and second electrodes, and a second portion opposite to the first portion, the first portion is disposed relatively farther away from a floor surface of the concave portion than the second portion.

30. The display device of claim 21, wherein
in each of the first and second unit pixels, the concave portions respectively provided in the first to third subpixels are provided adjacent to a center portion of a corresponding first or second unit pixel.

31. The display device of claim 21, wherein
the third subpixel of each second unit pixel is provided to have a width which is narrower than a width of each of the first and second subpixels.

32. The display device of claim 21, wherein
each of the subpixels further comprises:
the light emitting device connected to the pixel circuit, and the light emitting device is a light emitting diode or a micro light emitting diode chip.

33. The display device of claim 1, wherein the display substrate includes a base plate, the data routing film is bent in a shape matching one edge of the base plate and is adhered to the one edge of the base plate.

34. The display device of claim 1, wherein each of the subpixels further comprises:
 a pixel circuit connected to a corresponding gate line and a corresponding data line; and
 wherein the light emitting device is connected to the pixel circuit, and
 wherein the light emitting device is a light emitting diode or a micro light emitting diode chip.

35. A display device comprising:
 a display substrate including a plurality of subpixels, respectively provided in a plurality of pixel areas defined by a plurality of data lines and a plurality of gate lines, and a pad part connected to each of the plurality of data lines or gate lines in a one-to-one relationship, each subpixel including:
  a passivation layer;
  a light emitting device on the passivation layer,
  a pixel electrode; and
  a common electrode;
 a planarization layer covering the passivation layer and the light emitting device;
 a routing film adhered to the pad part, the routing film including a plurality of data routing lines respectively connected to the plurality of data lines or a plurality of gate routing lines respectively connected to the plurality of gate lines,
 wherein the routing film is on the pad part provided on a front surface of the display substrate; and
 wherein the planarization layer is positioned between the pixel electrodes and the passivation layer and between the common electrodes and the passivation layer.

36. A multi-screen display device comprising:
 a plurality of screen modules; and
 a plurality of module coupling members coupling side surfaces of the plurality of screen modules,
 wherein the plurality of screen modules each comprise the display device of claim 35.

37. The display device of claim 35, wherein the routing film comprises a base film including a plurality of routing lines,
 wherein the base film is black colored.

38. The display device of claim 35, wherein a corner of the display substrate surrounded by the routing film is chamfered by a certain angle or a certain length or is rounded by a certain curvature.

39. The display device of claim 35, further comprising a transparent buffer layer covering the planarization layer,
 wherein each of the pixel electrode and the common electrode is provided between the planarization layer and the transparent buffer layer, and
 wherein the transparent buffer layer comprises an optical clear adhesive (OCA) or an optical clear resin (OCR).

40. A multi-screen display device comprising:
 a plurality of screen modules, each screen module including a display device and side surfaces, the display device includes:
  a display substrate including a plurality of subpixels, respectively provided in a plurality of pixel areas defined by a plurality of data lines and a plurality of gate lines, and a pad part connected to each of the plurality of data lines or gate lines in a one-to-one relationship; and
  a routing film adhered to the pad part, the routing film including a plurality of data routing lines respectively connected to the plurality of data lines or a plurality of gate routing lines respectively connected to the plurality of gate lines,
  wherein the routing film is on the pad part provided on a front surface of the display substrate;
 a plurality of module coupling members coupling the side surfaces of respective screen modules to other respective screen modules of the plurality of screen modules;
 wherein
 a maximum distance between second unit pixels of two screen modules which are adjacent to each other with one of the plurality of module coupling members therebetween is equal to or less than a reference pixel pitch of a unit pixel including the plurality of subpixels, and
 wherein the reference pixel pitch is a distance between center portions of two adjacent unit pixels.

* * * * *